United States Patent
Ohtani et al.

(10) Patent No.: US 6,297,997 B1
(45) Date of Patent: Oct. 2, 2001

(54) SEMICONDUCTOR DEVICE CAPABLE OF REDUCING COST OF ANALYSIS FOR FINDING REPLACEMENT ADDRESS IN MEMORY ARRAY

(75) Inventors: Jun Ohtani; Mitsuhiro Hamada, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/459,538

(22) Filed: Dec. 13, 1999

(30) Foreign Application Priority Data

Jun. 30, 1999 (JP) .................................................. 11-186168

(51) Int. Cl.⁷ ...................................................... G11C 7/00
(52) U.S. Cl. ...................... 365/201; 365/189.07; 365/200
(58) Field of Search .................... 365/200, 201, 365/230.03, 189.04, 189.07, 210

(56) References Cited

U.S. PATENT DOCUMENTS

| | | | |
|---|---|---|---|
| 5,903,575 | * 5/1999 | Kikuda | 371/21.2 |
| 5,909,404 | * 6/1999 | Schwarz | 365/201 |
| 5,956,350 | * 9/1999 | Irrinki et al. | 371/21.1 |
| 6,011,734 | * 1/2000 | Pappert | 365/200 |

FOREIGN PATENT DOCUMENTS 9-245498   9/1997   (JP) .

\* cited by examiner

*Primary Examiner*—David Nelms
*Assistant Examiner*—Thong Le
(74) *Attorney, Agent, or Firm*—McDermott, Will & Emery

(57) ABSTRACT

In a semiconductor device including banks A and B, testing and redundancy analysis of the bank B are first carried out by using a conventional tester, and redundancy replacement is carried out. Then, the bank A is tested by a BIST circuit and the test result of each bit is written to the bank B. By using the bank B as a memory for defect analysis, a tester connected to the semiconductor device while testing the bank A does not need a large capacity analysis memory. Thus, an inexpensive redundancy analysis system can be provided.

13 Claims, 23 Drawing Sheets

SEMICONDUCTOR DEVICE CAPABLE OF REDUCING COST OF ANALYSIS FOR FINDING REPLACEMENT ADDRESS IN MEMORY ARRAY

BACKGROUND OF THE INVENTION

1. Field of the Invention

The present invention relates to semiconductor devices and methods of testing a semiconductor device. More specifically, the present invention relates to a semiconductor device having a plurality of memory regions and a function of self-testing the contained memory regions as well as a method of testing a semiconductor device.

2. Description of the Background Art

As semiconductor devices have higher functions and memories with larger capacity in recent years, BISTs (built-in self tests) have increasingly been adapted to reduce test cost.

FIG. 23 is a block diagram showing a configuration example of a conventional semiconductor device 260 including the BIST function.

Referring to FIG. 23, semiconductor device 260 includes an input buffer 34 receiving a control signal for self testing (hereinafter, referred to as a self test control signal) BISTIN, a BIST circuit 262 initiating a self test according to an output of input buffer 34, input buffers 20 to 26 receiving control signals BA, /RAS, /CAS, /WE, an input buffer 28 receiving an address signal AD, an input buffer 30 receiving a data input signal DI, and an output buffer 32 outputting a data output signal DO.

Semiconductor device 260 further includes a memory array 2a, as a bank A, which has a plurality of word lines WL, a plurality of bit lines BL, and memory cells corresponding to the crossings thereof, a corresponding row address decoder 4a and column address 6a, a memory array 2b as a bank B, and a corresponding row address decoder 4b and column address 6b.

Semiconductor device 260 further includes a spare row 8a, a spare row address decoder 10a, a spare column 12a, and a spare column address decoder 14a to repair a defective memory cell existing in memory array 2a. Similarly, semiconductor device 260 further includes a spare row 8b, a spare row address decoder 10b, a spare column 12b, and a spare column address decoder 14b to repair a defective memory cell existing in memory array 2b.

In the normal operation, semiconductor device 260 transmits data to contained banks A, B according to externally input control signals BA, /RAS, /CAS, /WE, address signal AD, and data input signal DI.

In the test operation, self test control signal BISTIN is activated. In response, input buffer 34 activates BIST circuit 262 and inactivates input buffers 20 to 30 and output buffer 32. BIST circuit 262 outputs an internal bank address signal BAI, an internal row address strobe signal /RASI, an internal column address strobe signal /CASI, an internal write control signal /WEI, and an internal address signal ADI. Banks A, B transmit data according to the control signals and the address signal output by BIST circuit 262. At this time, internal data signal IDI is generated by a prescribed algorithm in BIST circuit 262. Further, an internal data output signal IDO read from banks A, B is received in BIST circuit 262 to verify if it matches an expected value.

FIG. 24 is a block diagram showing a configuration of BIST circuit 262 shown in FIG. 23.

Referring to FIG. 24, BIST circuit 262 includes a control signal generator 264 activated by self test control signal BISTIN, receiving a clock signal for testing (hereinafter, referred to as a test clock signal) BISTCLK, and outputting internal control signals /RASI, /CASI, /WEI, an address generator 266 activated by self test control signal BISTIN, receiving test clock signal BISTCLK, and outputting internal address signal ADI and internal bank address signal BAI under the control of control signal generator 264, a data generator 268 activated by self test control signal BISTIN, receiving test clock signal BISTCLK, and generating, during self testing, write data to be written to a memory bank and expected value data of data read from the memory bank, and a data comparator 270 comparing an output of data generator 268 and internal data output signal IDO read from a memory bank. An output of data comparator 270 is externally output as a signal BISTOUT.

When the address of a cell to be repaired is stored in a register and the defective memory cell is repaired according to this information during self testing, a register capable of storing address information corresponding to the defective memory cell to be repaired is at least necessary.

Since a memory array is generally formed of rows and columns, replacement with spare rows and columns is carried out on the basis of a row and a column even for repairing defective memory cells.

For a series of defective cells on the same row or column caused, for example, by a word line or bit line defect, an optimum solution to replacement is inevitably found. It is easy to determine whether a semiconductor device having only such defects can be repaired.

For such a defect of a single memory cell that is called a bit defect, it is possible to repair the memory cell by replacement with either a spare row or a spare column. In order to carry out optimum replacement in a semiconductor device having such a bit defect, it is necessary to make a calculation based on the distribution of defective memory cells in the entire memory array and the number of redundant rows and columns capable of replacing defective ones. Finding an optimum row and column to be replaced is called repair solution finding.

When a register having only information on a row or column to be replaced is used, an optimum repair solution to a bit defect cannot be found, which results in a reduction in the repair rate.

FIG. 25 is a diagram for describing a configuration of a conventional memory tester for finding an optimum solution to a bit defect.

Referring to FIG. 25, test flows and test conditions according to test manners are programmed in an IC tester control CPU 851 of an IC tester 850. IC tester control CPU 851 applies a control signal to each circuit of IC tester 850 through a control signal transmission bus 852 if necessary and sets data for each circuit. A reference signal generation circuit 853 generates an operation reference signal for IC tester 850. The reference signal becomes the basis of a cycle in which test waveform conditions are changed (hereinafter, referred to as a test cycle). The reference signal is applied to a timing generator 855 and a program power supply 860.

Timing generator 855 controls the timing of a test waveform change, for example. A test pattern storing circuit 856 determines the pattern of a test waveform for each test cycle. A functional test pattern generator 857 which is formed of a high speed microcomputer generates address and data to be applied to devices under test DUT1 to DUTn, and controls clocking. A format circuit 858 produces a test waveform by synthesizing for each test cycle a timing signal applied from timing generator 855, a test pattern applied from test pattern storing circuit 856, and logical data applied from functional test pattern generator 857. Timing generator 855, test pattern storing circuit 856, and format circuit 858 constitute a waveform formation circuit 859.

Program power supply 860 is formed of a bias voltage supply unit supplying devices under test DUT1 to DUTn with power supply voltage, and a data level power supply determining the level of drivers and comparators in pin electronics 861. Pin electronics 861 is formed of drivers, comparators, and relays connecting them to devices under test DUT1 to DUTn. Pin electronics 861 determines, by using the contained comparators, whether the output waveforms of devices under test DUT1 to DUTn are normal or not according to a timing signal applied from timing generator 855 and a voltage value from program power supply 860.

The determination result is supplied to analysis memory 862 through functional test pattern generator 857. Analysis memory 862 stores the test result of devices under test DUT1 to DUTn supplied from functional test pattern generator 857. According to information on a defective cell address, a defect analysis circuit 863 carries out the redundancy analysis of devices under test DUT1 to DUTn, that is, analysis for finding an optimum address to be replaced.

As memories contained in a device under test have larger capacity, it becomes costly to provide a memory tester or the like with an analysis memory having the same capacity as the contained memories.

Considering a case where a plurality of devices under test are tested at the same time, the capacity of an analysis memory becomes extremely large and the test system is very expensive.

If the analysis memory is provided inside a semiconductor device, a test memory having the same space as the contained memory space is required. Since this doubles the chip area, it is meaningless to provide the analysis memory itself.

In order to efficiently repair a defective memory cell using a spare column and a spare row in the conventional art, the test system becomes very expensive as the memory capacity increases.

SUMMARY OF THE INVENTION

An object of the present invention is to provide a semiconductor device capable of efficiently repairing a defective memory cell by replacement using an inexpensive test system.

In summary, the present invention is a semiconductor device including first and second memory regions and a memory control circuit. The first and second memory regions carry out a storing operation for holding applied data. The first and second memory regions each include a plurality of normal memory cells arranged in rows and columns, a spare row replacing a normal row including a defective memory cell in the plurality of normal memory cells, and a spare column replacing a normal column including a defective memory cell in the plurality of normal memory cells. The memory control circuit controls the operation of the first and second memory regions according to a designated operation mode. The memory control circuit is inactivated when the operation mode is a normal mode, and generates test data to be written to the first memory region when the operation mode is a test mode. The memory control circuit includes a self test circuit reading data held in the first memory region after the test data is written and determining whether or not memory cells are good according to the comparison result of the read value and an expected value, and a data transfer circuit transmitting applied data to the first and second memory regions in the normal mode, transmitting the test data to the first memory region and transferring the comparison result to the second memory region in the test mode.

According to another aspect of the present invention, a method of testing a semiconductor device including first and second memory banks, a replacement circuit repairing a defective bit in the first and second memory banks, a self test circuit, and a data transfer circuit includes the steps of testing the second memory bank to repair a defective memory cell included in the second memory bank using the replacement circuit, testing the first memory bank using the self test circuit and writing the test result to the second memory bank through the data transfer circuit, and reading the test result written to the second memory bank to find a row address of the row to be replaced and a column address of the column to be replaced for replacement with a spare row and a spare column.

Therefore, a main advantage of the present invention is that address information on a defective memory cell can be held inside a semiconductor device, and thus a defect analysis memory device of an external tester can be simplified and an inexpensive test system can be formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
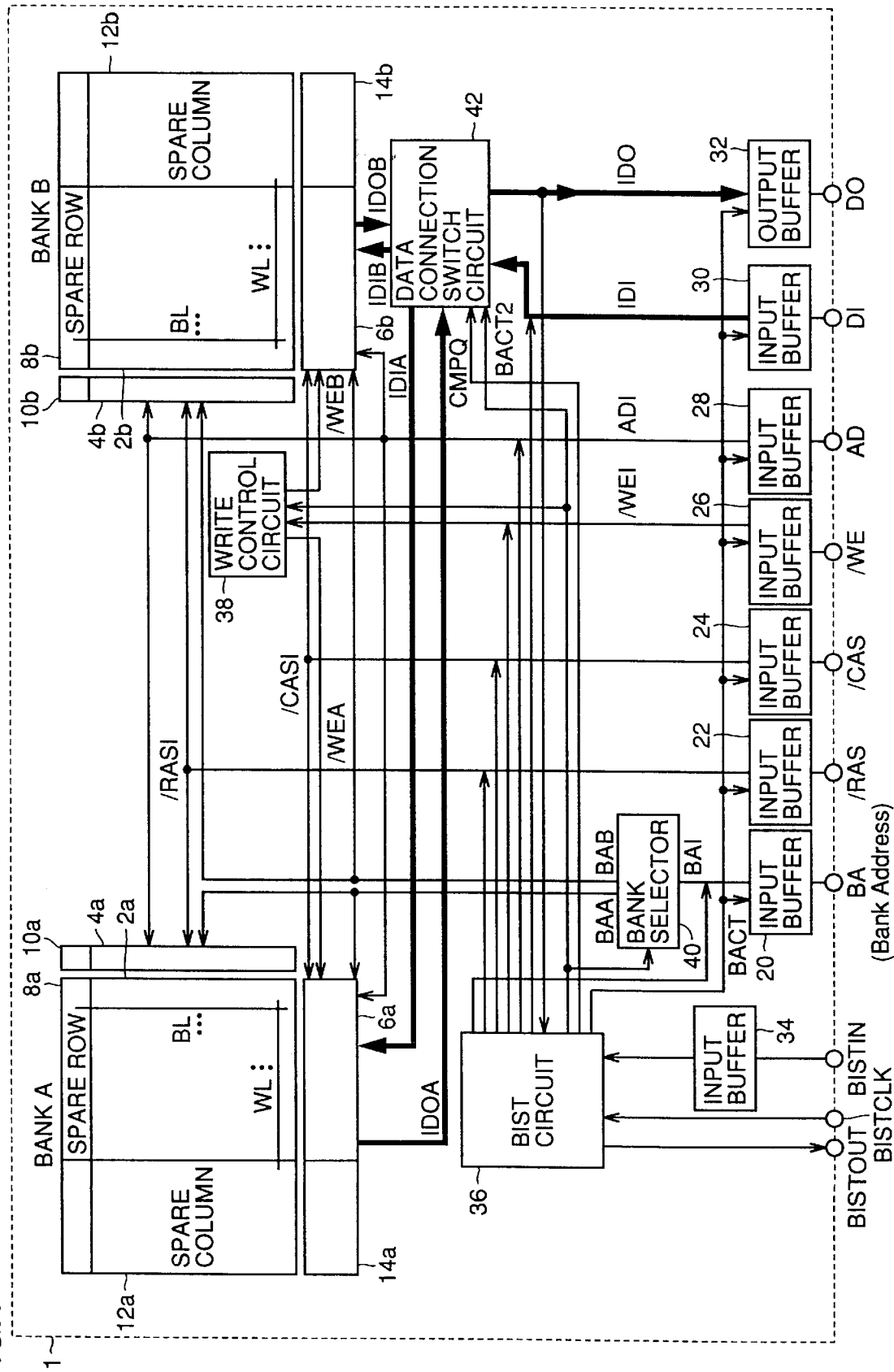
FIG. 1 is a schematic block diagram showing a configuration of a semiconductor device 1 in a first embodiment of the present invention.

In the following, the embodiments of the present invention will be described in detail with reference to the drawings. The same reference characters denote the same or corresponding parts in the drawings.

First Embodiment

FIG. 1 is a schematic block diagram showing a configuration of a semiconductor device 1 in a first embodiment of the present invention.

Referring to FIG. 1, semiconductor device 1 includes an input buffer 34 receiving a control signal for self testing (hereinafter, referred to as a self test control signal) BISTIN, a BIST circuit 36 receiving an output of input buffer 34 and starting a self test in response to a clock signal for testing (hereinafter, referred to as a test clock signal) BISTCLK, input buffers 20 to 26 receiving control signals BA, /RAS, /CAS, /WE, an input buffer 28 receiving an address signal AD, an input buffer 30 receiving a data input signal DI, and an output buffer 32 outputting a data output signal DO.

Semiconductor device 1 further includes a memory array 2a, as a bank A, including a plurality of word lines WL, a plurality of bit lines BL, and memory cells corresponding to the crossing thereof, corresponding row and column address decoders 4a, 6a, a memory array 2b as a bank B, and corresponding row and column address decoders 4b, 6b.

Semiconductor device 1 further includes a spare row 8a, a spare row address decoder 10a, a spare column 12a, and a spare column address decoder 14a to spare a defective memory cell existing in memory array 2a.

Similarly, semiconductor device 1 further includes a spare row 8b, a spare row address decoder 10b, a spare column 12b, and a spare column address decoder 14b to repair a defective memory cell existing in memory array 2b.

Semiconductor device 1 further includes a bank selector 40, a write control circuit 38, and a data connection switch circuit 40 which are used for a test to find a redundancy repair solution. In the normal operation, bank selector 40 outputs a bank activation signal BAA for activating bank A and a bank activation signal BAB for activating bank B according to an output of input buffer 20. In the test mode, bank selector 40 outputs bank activation signals BAA, BAB according to signals BAI, BACT output by the BIST circuit. It is noted that the redundancy repair solution is a combination of suitable row and column addresses to be replaced which are found to efficiently repair a defective memory cell.

When a signal BACT2 output by BIST circuit 36 is at the L level, that is, in the normal operation, write control circuit 38 activates both of a write signal /WEA for bank A and a write enable signal /WEB for bank B according to an output signal /WEI of input buffer 26. When signal BACT2 is at the H level, that is, in the test mode, write control circuit 38 activates write enable signal /WEB for bank B when data is read from bank A.

In the normal operation, data connection switch circuit 42 outputs an internal data input signal IDI according to data input signal DI as a data signal IDIA to bank A and as a data signal IDIB to bank B. An activated bank receives the data signal. Further, data connection switch circuit 42 receives an internal data output signal IDOA output when bank A is activated and an internal data output signal IDOB output when bank B is activated and outputs a data output signal IDO.

Data output signal IDO is externally output as a data output signal DO by output buffer 32.

Figure 2:
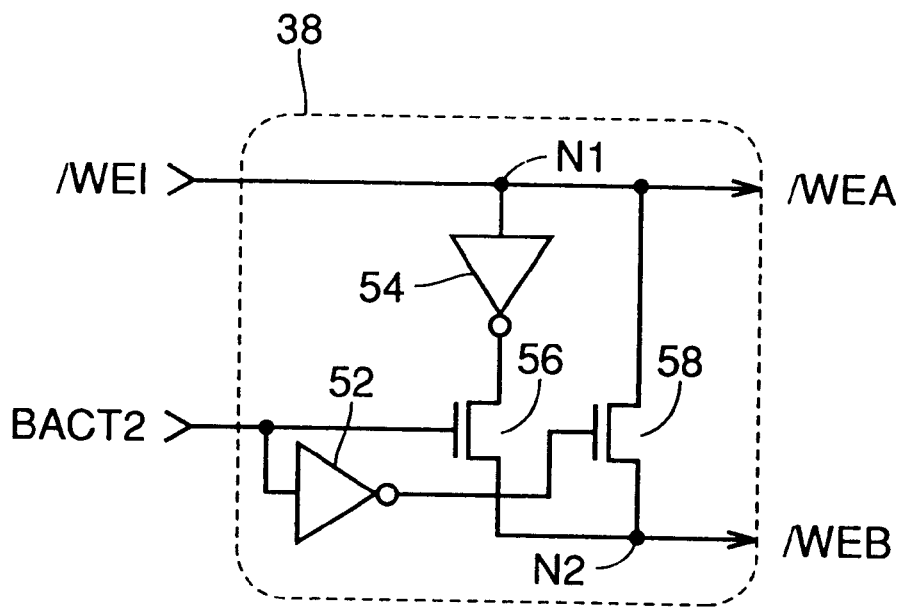
FIG. 2 is a circuit diagram showing a configuration of write control circuit 38 shown in FIG. 1.

FIG. 2 is a circuit diagram showing a configuration of write control circuit 38.

Referring to FIG. 2, write control circuit 38 includes a node N1 supplied with internal write control signal /WEI, an inverter 54 having its input node connected to node N1, an inverter 52 receiving test signal BACT2, an N channel MOS transistor 56 receiving test signal BACT2 at its gate and connected between the output node of inverter 54 and a node N2, and an N channel MOS transistor 58 having its gate supplied with an output of inverter 52 and connected between nodes N1 and N2.

Write control circuit 38 outputs write control signal /WEA for bank A from node N1 and write control signal /WEB for bank B from node N2.

Figure 3:
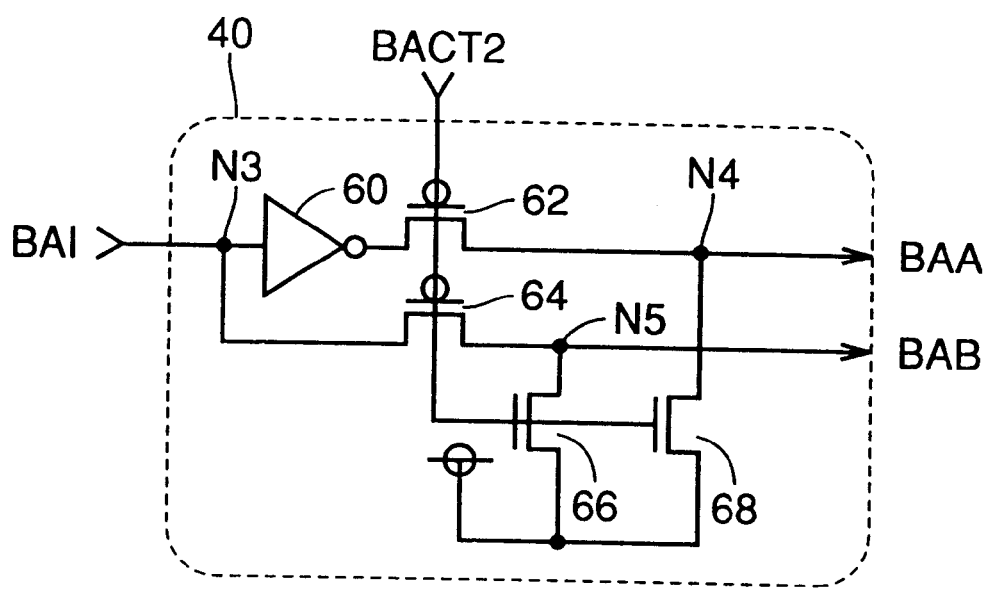
FIG. 3 is a circuit diagram showing a configuration of bank selector 40 shown in FIG. 1.

FIG. 3 is a circuit diagram showing a configuration of bank selector 40.

Referring to FIG. 3, bank selector 40 includes a node N3 supplied with internal bank address signal BAI, an inverter 60 having its input connected to node N3, a P channel MOS transistor 64 having its gate supplied with test signal BACT2 and connected between nodes N3 and N5, a P channel MOS transistor 62 having its gate supplied with test signal BACT2 and connected between the output node of inverter 60 and a node N4, an N channel MOS transistor 66 connected between a power supply node and node N5 and having its gate supplied with test signal BACT2, and an N channel MOS transistor 68 connected between the power supply node and node N4 and having its gate supplied with test signal BACT2.

As output signals of bank selector 40, bank activation signal BAA is output from node N4 to bank A and bank activation signal BAB is output from node N5 to bank B.

Figure 4:
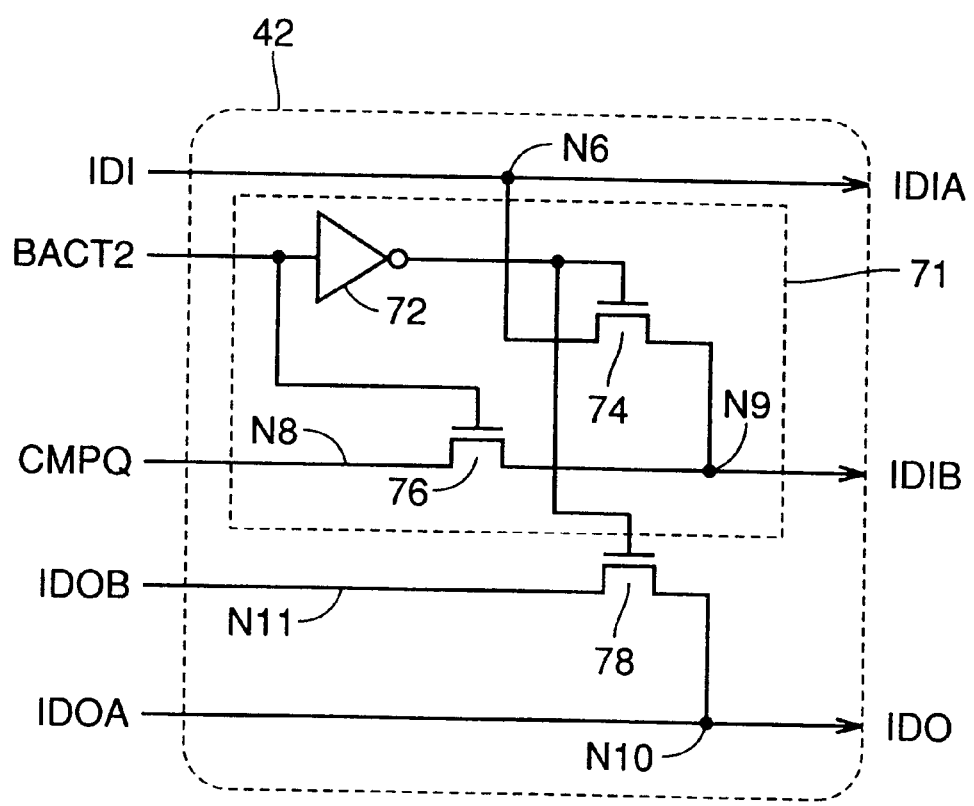
FIG. 4 is a circuit diagram showing a configuration of data connection switch circuit 42 shown in FIG. 1.

FIG. 4 is a circuit diagram showing a configuration of data connection switch circuit 42.

Referring to FIG. 4, data connection switch circuit 42 includes a node N6 supplied with internal data signal IDI, an input switch circuit 71 outputting, as an output IDIB for bank B, either a comparison signal CMPQ supplied from BIST circuit 36 or internal data signal IDI according to test signal BACT2, nodes N10, N11 supplied with internal data output signals IDOA, IDOB from banks A, B, and an N channel MOS transistor 78 receiving an output of inverter 72 at its gate and connected between nodes N11 and N10.

Input switch circuit 71 includes an inverter 72 receiving and inverting test signal BACT2, an N channel MOS transistor 74 receiving an output of inverter 72 at its gate and connected between nodes N6 and N9, a node N8 supplied with comparison signal CMPQ from BIST circuit 36, and an N channel MOS transistor 76 receiving test signal BACT2 at its gate and connected between nodes N8 and N9.

Data connection switch circuit 42 outputs internal data signal IDIA from node N6 to bank A. Data connection switch circuit 42 outputs internal data input signal IDIB from node N9 to bank B. Data connection switch circuit 42 also outputs internal data output signal IDO from node N10 to output buffer 32 shown in FIG. 1.

Figure 5:
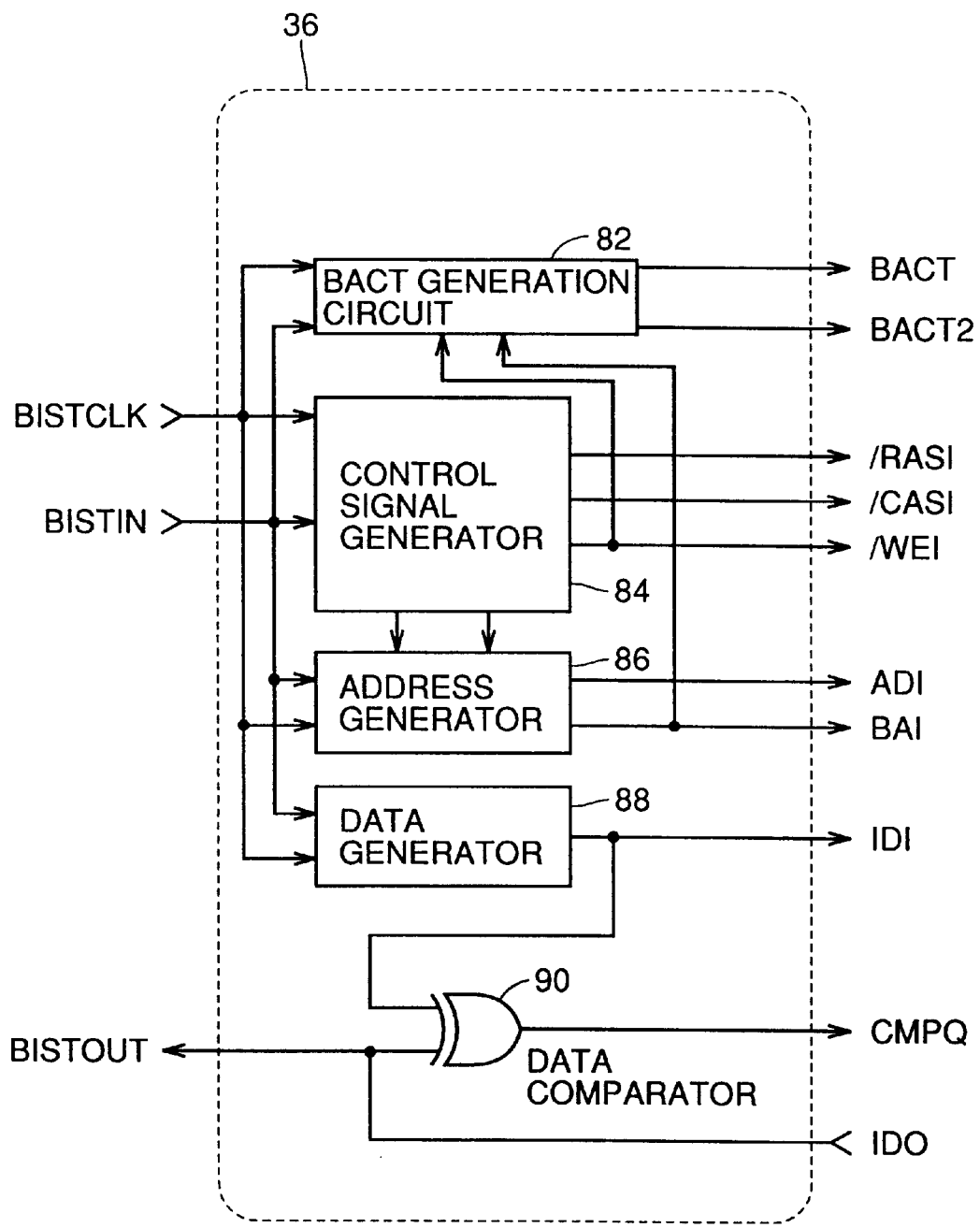
FIG. 5 is a block diagram showing a configuration of BIST circuit 36 shown in FIG. 1.

FIG. 5 is a block diagram showing a configuration of BIST circuit 36 shown in FIG. 1.

Referring to FIG. 5, BIST circuit 36 includes a control signal generator 84 activated by self test control signal BISTIN, receiving test clock signal BISTCLK, and outputting internal control signals /RASI, /CASI, /WEI, an address generator 86 activated by self test control signal BISTIN, receiving test clock signal BISTCLK, and outputting internal address signal ADI and internal bank address signal BAI under the control of control signal generator 84, a data generator 88 activated by self test control signal BISTIN, receiving test clock signal BISTCLK, and outputting internal data signal IDI, and a data comparator 90 comparing the output of data generator 88 and internal data output signal IDO read from a bank and outputting signal CMPQ indicating whether or not they match.

BIST circuit 36 further includes a BACT generation circuit 82 receiving self test control signal BISTIN, internal bank address signal BAI, internal clock control signal /WEI, and test clock signal BISTCLK and generates test signals BACT, BACT2.

Figure 6:
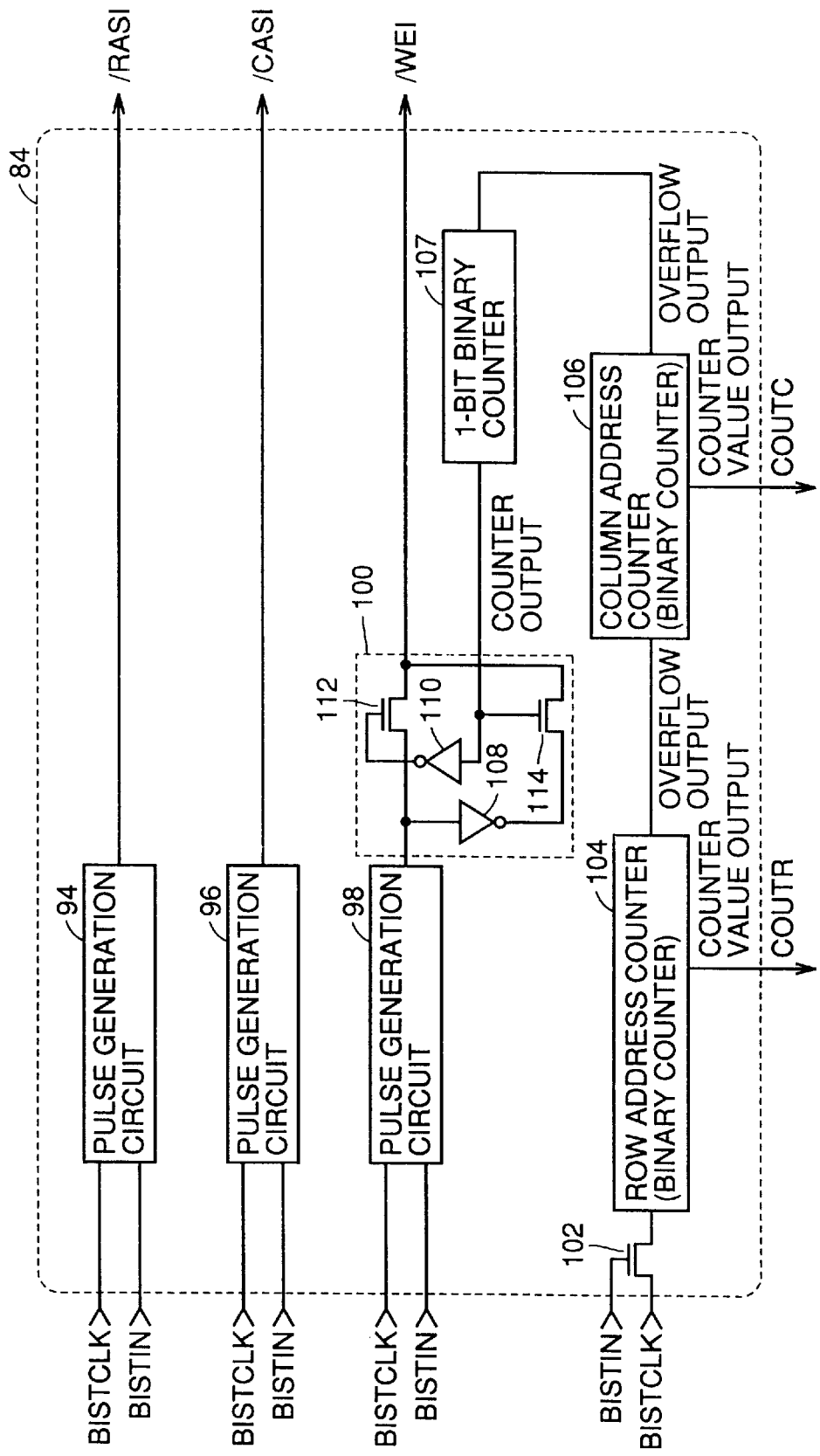
FIG. 6 is a block diagram showing a schematic configuration of control signal generator 84 in FIG. 5.

FIG. 6 is a block diagram showing a schematic configuration of control signal generator 84 in FIG. 5.

Referring to FIG. 6, control signal generator 84 includes a pulse generation circuit 94 activated by self test control signal BISTIN and outputting control signal /RASI as a pulse signal having a prescribed cycle according to test clock signal BISTCLK, a pulse generation circuit 96 activated by self test control signal BISTIN and outputting control signal /CASI in a prescribed cycle according to test clock signal BISTCLK, and a pulse generation circuit 98 activated by self test control signal BISTIN and generating a pulse in a prescribed cycle according to test clock signal BISTCLK.

Control signal generator 84 further includes a transistor 10 activated by self test control signal BISTIN and internally transmitting test clock signal BISTCLK, a row address counter 104 outputting a count value COUTR as a reference of row addresses during testing according to test clock signal BISTCLK transmitted by transistor 102, a column address counter 106 receiving and counting an overflow output of address counter 104 and outputting a count value COUTC as a reference of column addresses during testing, and a 1-bit binary counter 107 receiving and counting an overflow output of column address counter 106.

Control signal generator 84 further includes an inversion select circuit 100 inverting an output of pulse generation circuit 98 and outputting it as control signal /WEI when an output of 1-bit binary counter 107 is at the H level, and outputting the output of pulse generation circuit 98 as it is as control signal /WEI when the output of 1-bit binary counter 107 is at the L level Inversion select circuit 100 includes an inverter 108 receiving and inverting the output of pulse generation circuit 98, a transistor 114 rendered conductive and outputting an output of inverter 108 as control signal /WEI when the output of 1-bit binary counter 107 is at the H level, an inverter 110 receiving an inverting the output of 1-bit binary counter 107, and a transistor 112 rendered conductive and outputting the output of pulse generation circuit 98 as it is as control signal /WEI when the output of inverter 110 is at the H level.

Figure 7:
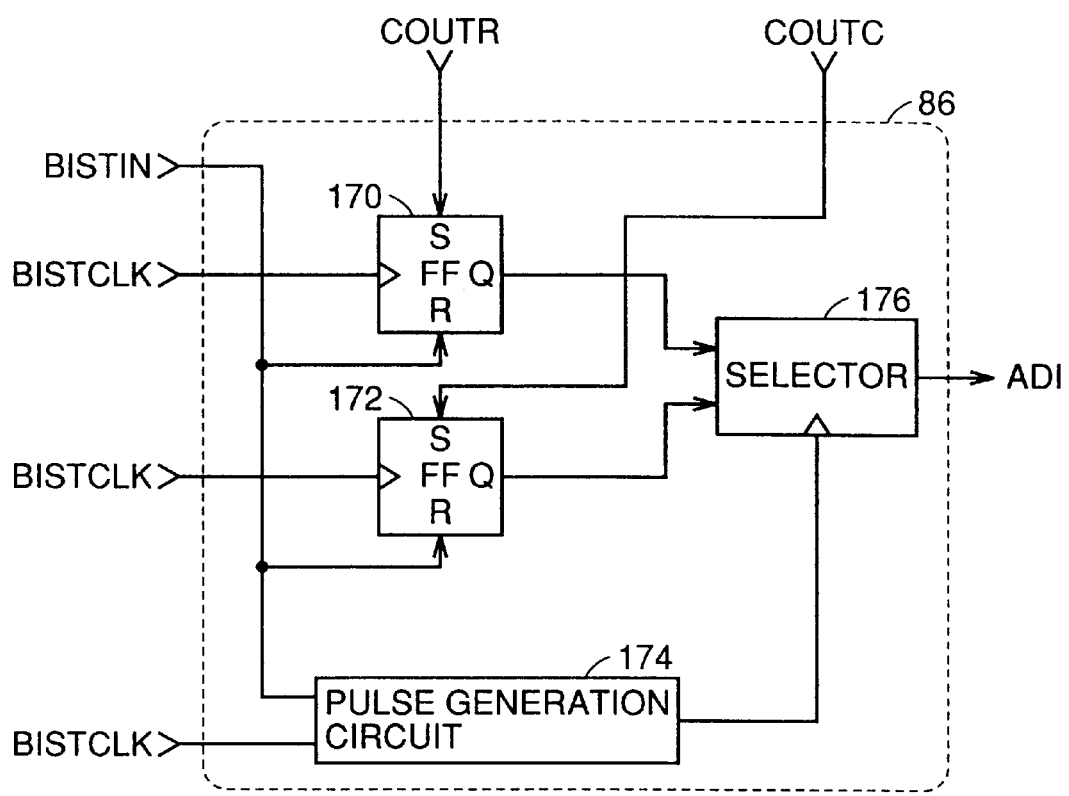
FIG. 7 is a block diagram showing a schematic configuration of address generator 86 in FIG. 5.

FIG. 7 is a block diagram showing a schematic configuration of address generator 86 in FIG. 5.

Referring to FIG. 7, address generator 86 includes a flip-flop 170 reset according to a change in self test control signal BISTIN at the time of starting self testing and receiving count COUTR in response to test clock signal BISTCLK, a flip-flop 172 reset in response to activation of self test control signal BISTIN at the beginning of self testing and receiving count value COUTC in response to test clock signal BISTCLK, a pulse generation circuit 174 activated by self test control signal BISTIN and generating a pulse in a prescribed cycle based on test clock signal BISTCLK, and a selector 176 outputting, as internal address signal ADI, a value held by one of flip-flops 170, 172 according to the output of pulse generation circuit 174.

Figure 8:
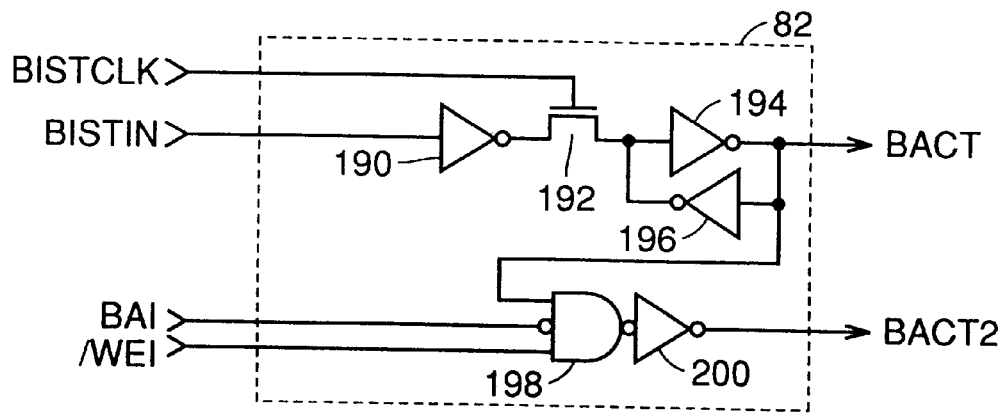
FIG. 8 is a circuit diagram showing a configuration of BACT generation circuit 82 in FIG. 5.

FIG. 8 is a circuit diagram showing a configuration of BACT generation circuit 82 in FIG. 5.

Referring to FIG. 8, BACT generation circuit 82 includes an inverter 190 receiving and inverting self test control signal BISTIN, a transistor 192 activated by test clock signal BISTCLK and transmitting an output of inverter 190, an inverter 194 receiving and inverting the output of inverter 190 and outputting test signal BACT when transistor 192 is active, an inverter 196 receiving and inverting signal BACT and outputting it to the input node of inverter 194, a gate circuit 198 taking NAND of an inverted value of internal bank address signal BAI, test signal BACT, and control signal /WEI, and an inverter 200 inverting an output of gate circuit 198 and outputting test signal BACT2.

Figure 9:
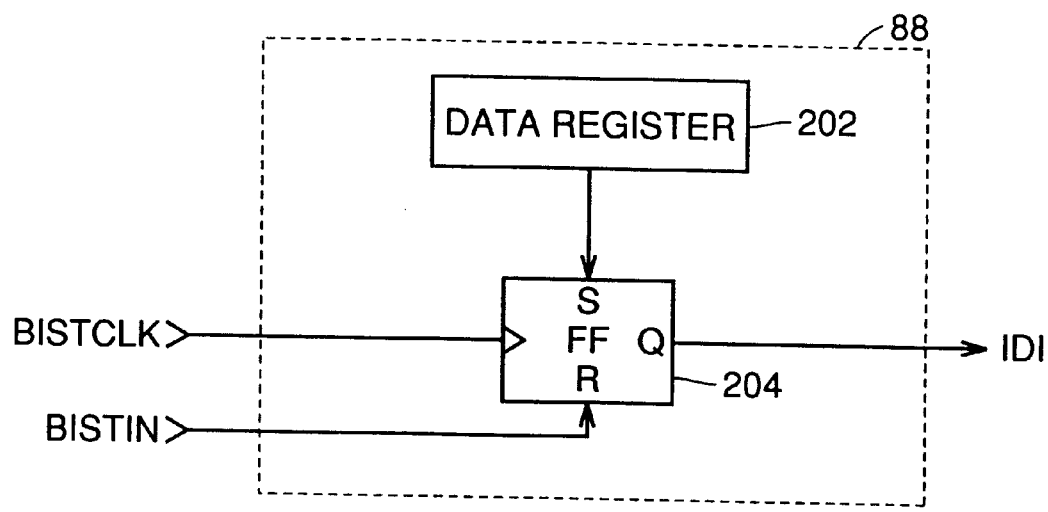
FIG. 9 is a block diagram showing a configuration of data generator 88 in FIG. 5.

FIG. 9 is a block diagram showing a configuration of data generator 88 in FIG. 5.

Referring to FIG. 9, data generator 88 includes a data register 202, and a flip-flop 204 reset in response to activation of self test control signal BISTIN at the beginning of self testing and latching an output of data register 202 in synchronization with reset test clock signal BISTCLK. Flip-flop 204 outputs internal data signal IDI.

FIG. 9 does not particularly show a configuration of data register 202. Data register 202 outputs data according, for example, to the results of logical operations of least significant bits in row and column address signals.

Figure 10:
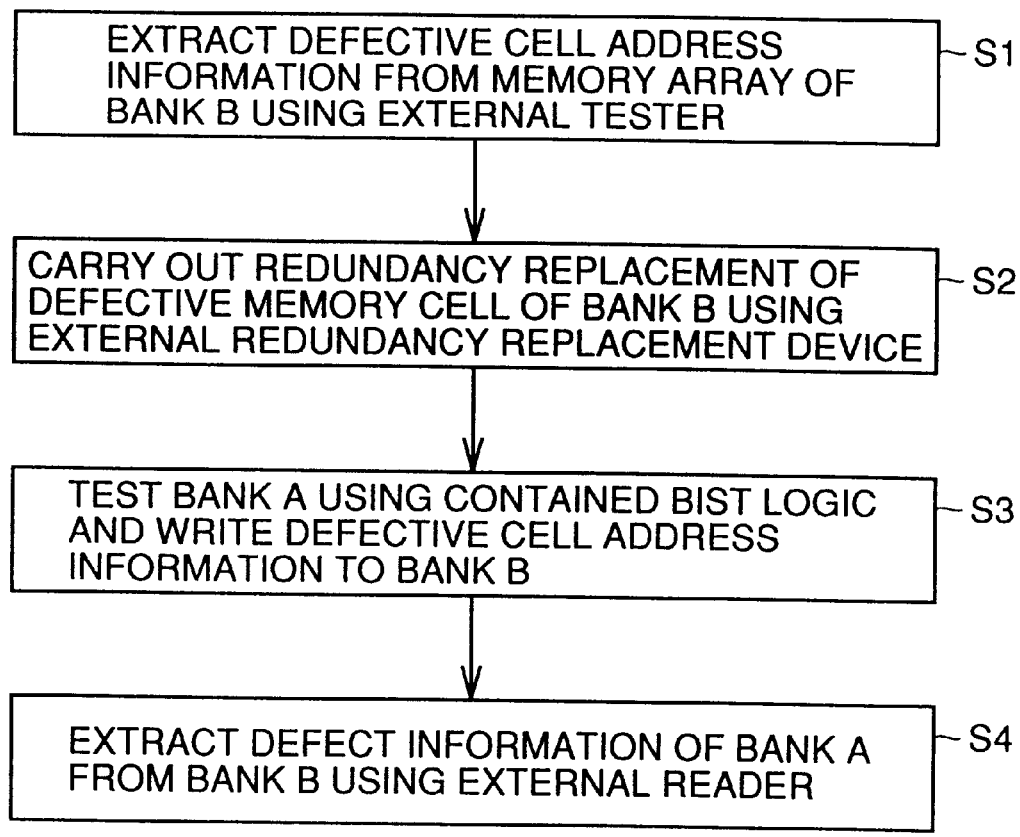
FIG. 10 is a flow chart for describing a test flow of the semiconductor device in the first embodiment.

FIG. 10 is a flow chart for describing a test flow of the semiconductor device in the first embodiment.

Referring to FIGS. 1 and 10, the test is performed by storing a test result of each memory cell of bank A in a memory cell of bank B and using bank B as an analysis memory when bank A is tested to replace a defective memory cell with a redundancy memory cell.

In step S1, the memory array of bank B is first tested and defective cell address information is extracted from the memory array of bank B by using an external tester.

In step S2, an external redundancy replacement device is used to replace a defective memory cell of bank B with a redundancy memory cell so that optimum repairing is carried out based on the defective cell address information extracted in step S1.

If a cell at the defective cell address of bank B has been repaired by a general purpose external tester and a general purpose external redundancy replacement device as described above, bank B can correctly store the defective cell address information of bank A.

In step S3, bank A is tested by using the contained BIST circuit and its defective cell address information is written to bank B.

In step S4, the defect information of bank A is extracted from bank B by using an external reader. The defective memory cell in bank A can be replaced by a redundancy cell by analyzing the extracted defect information.

In the first embodiment, the banks are only two banks of banks A and B, for example. Even if the number of banks increases, by using a repaired bank as a defect analysis memory for storing defective cell address information and sequentially finding repair solutions of a plurality of banks, the capacity of the defect analysis memory necessary for a general purpose memory tester can be reduced when a repair solution is found by using the general purpose memory tester, which is useful in reducing the cost of a tester, that is, a semiconductor device.

Figure 11:
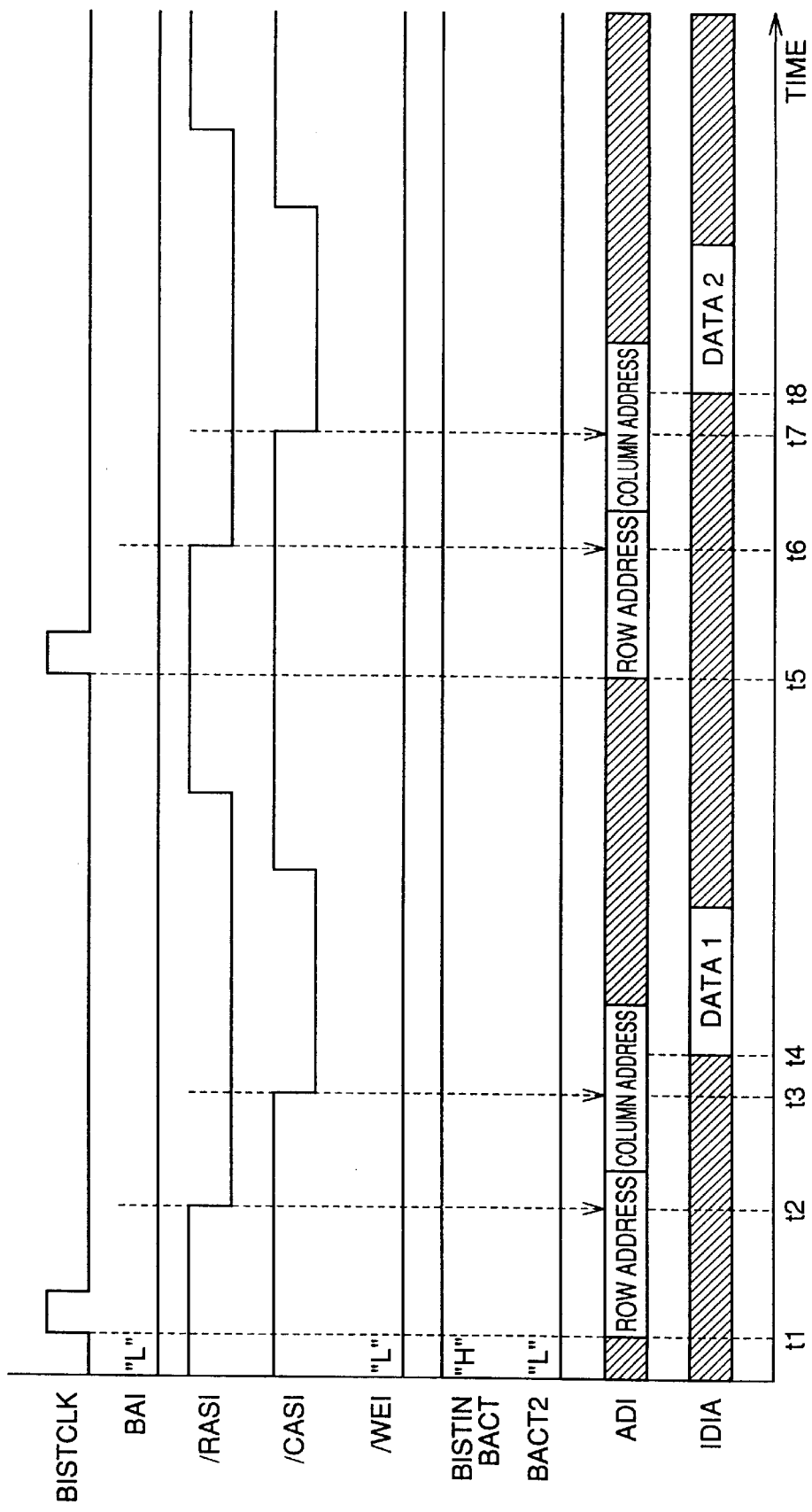
FIG. 11 is an operating waveform chart for describing an operation for writing data to bank A by the BIST circuit in step S3 shown in FIG. 10.

FIG. 11 is an operating waveform chart for describing an operation of writing data to bank A by the BIST circuit in step S3 shown in FIG. 10.

Referring to FIG. 11, a row address signal is generated from address generator 86 in FIG. 5 in synchronization with externally supplied test dock BISTCLK at time t1.

At time t2, control signal /RASI is then generated from control signal generator 84 in FIG. 5. In response to activation of control signal /RASI, bank A takes in the row address.

At time t3, a column address signal is generated from address generator 86 and then control signal /CASI is output from control signal generator 84. In response to activation of control signal /CASI, bank A takes in the column address. Thus, a memory cell designated by the row and column addresses is temporarily selected in bank A. At time t4, DATA 1 to be written to bank A is output from data generator 88. At this time, control signal /WEI is at the L level, and write control signal /WEA of bank A is also at the L level according to write control circuit 38 shown in FIG. 2. Thus, the data is written to bank A. According to a similar sequence, DATA 2 is written to bank A from time t5 to time t8.

Figure 12:
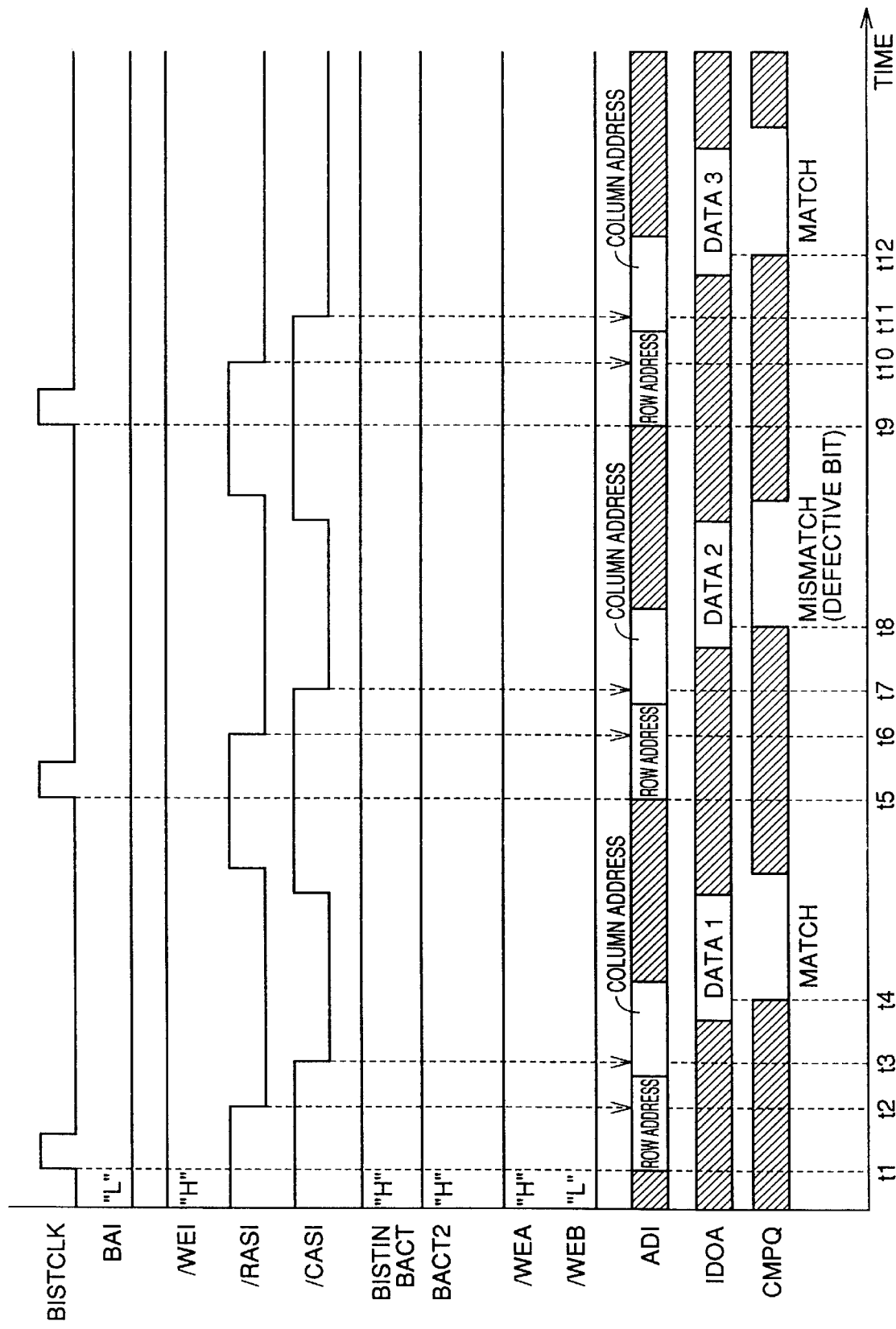
FIG. 12 is an operating waveform chart for describing an operation for reading data from bank A and writing a test result to bank B.

FIG. 12 is an operating waveform chart for describing an operation of reading data from bank A and writing a test result to bank B.

Referring to FIG. 12, since BIST circuit 36 causes control signal /WEI to attain the H level, BACT generation circuit 82 shown in FIG. 8 causes test signal BACT2 to assume the H level. Bank selector 40 shown in FIG. 3 activates both banks A and B. Write control circuit 38 controls data reading from bank A and data writing to bank B. When test signal BACT2 is at the H level, data connection switch circuit 42 shown in FIG. 4 outputs comparison result signal CMPQ, which is a test result of bank A, output by BIST circuit 36 as data input signal IDIB for bank B.

At time t1, test clock BISTCLK is input and address generator 86 in FIG. 5 outputs a row address. At time t2, control signal generator 84 in FIG. 5 activates control signal /RASI. In response, the column address is received in banks A and B.

At time t3, control signal generator 84 activates control signal /CASI. In response, a column address is received in banks A and B. Then, bank A outputs read DATA 1. In FIG. 5, the data signal output from bank A and an expected value of the data generated by data generator 88 are compared by data comparator 90, and the result is output as comparison result signal CMPQ. At time t4, a case where the comparison result indicating a match is shown, and the level of comparison result signal CMPQ is at the L level as a result.

At time t5, t6, t7, a similar operation is also carried out to that at time t1, t2, t3. At time t8, DATA 2 is read from bank A and the result is checked by data comparator 90. At time t8, the comparison result indicates a mismatch, and therefore the signal level is at the H level. In other words, a memory cell of bank A which corresponds to the row and column addresses designated at this time is a defective bit.

At time t9, t10, t11, t12, a similar operation is also carried out to that at time t1, t2, t3, t4, and description thereof will not be repeated.

As described with respect to FIGS. 11 and 12, by repeating a series of operations shown in FIG. 11 for each memory cell in a bank, data output from the BIST circuit are all written to the memory cells of bank A. Thereafter, by performing a series of operations shown in FIG. 12 for each address space of bank A, defective cell address information of bank A is stored in a corresponding address in bank B. Therefore, information on a defective memory cell in bank A can be obtained by referring to the memory of bank B.

Conventionally, defective cell address information of a memory cell can only be held by an external device. In this embodiment, however, the defective cell address information can be held inside a semiconductor, which makes it possible to simplify a defect analysis memory device of an external tester and form an inexpensive test system.

Although an interface of each bank is a general purpose DRAM in the first embodiment, a similar method can be employed even when a much higher speed interface such as a synchronous DRAM, which transmits data at high speed in synchronization with a clock signal, is provided.

Although the number of banks is two in the first embodiment, there may be more banks in a device. In such a case, repaired banks are used to hold the test results of other banks. By increasing the number of repaired banks for storing defective cell addresses, defective cell address information of a plurality of banks can be held simultaneously.

Second Embodiment

Figure 13:
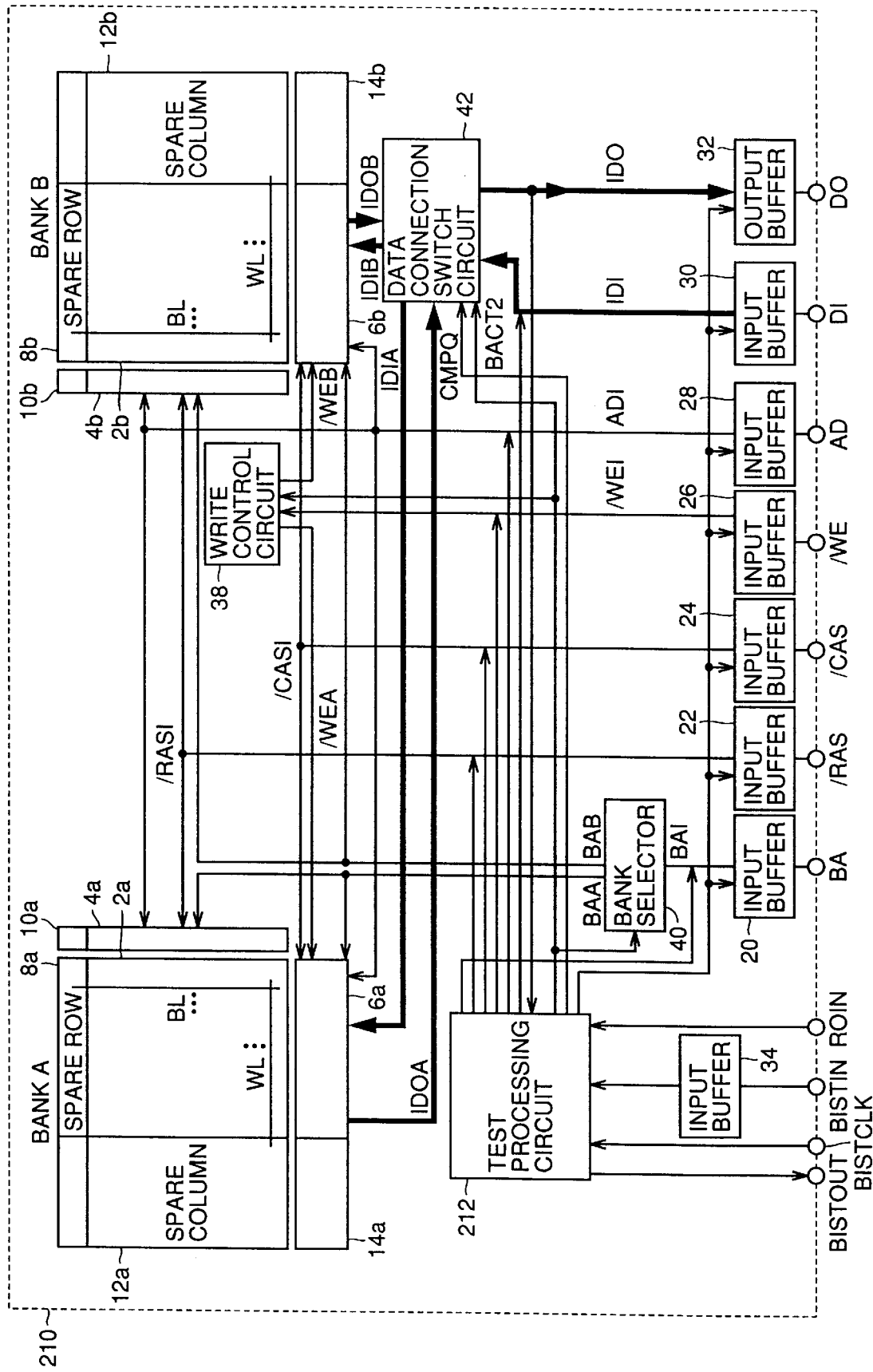
FIG. 13 is a block diagram showing a configuration of a semiconductor device 210 in a second embodiment.

FIG. 13 is a block diagram showing a configuration of a semiconductor device 210 in a second embodiment.

Referring to FIG. 13, semiconductor device 210 in the second embodiment includes a test processing circuit 212 instead of BIST circuit 36 in the configuration of semiconductor device 1 in the first embodiment shown in FIG. 1. Other parts have similar constructions to those of semiconductor device 1 shown in FIG. 1. Description thereof will not be repeated.

Test processing circuit 212 has a function of finding the address information of a row and a column to be replaced suitable for repairing bank A based on the test result including the defective cell address information of bank A stored in bank B2 in the first embodiment.

Figure 14:
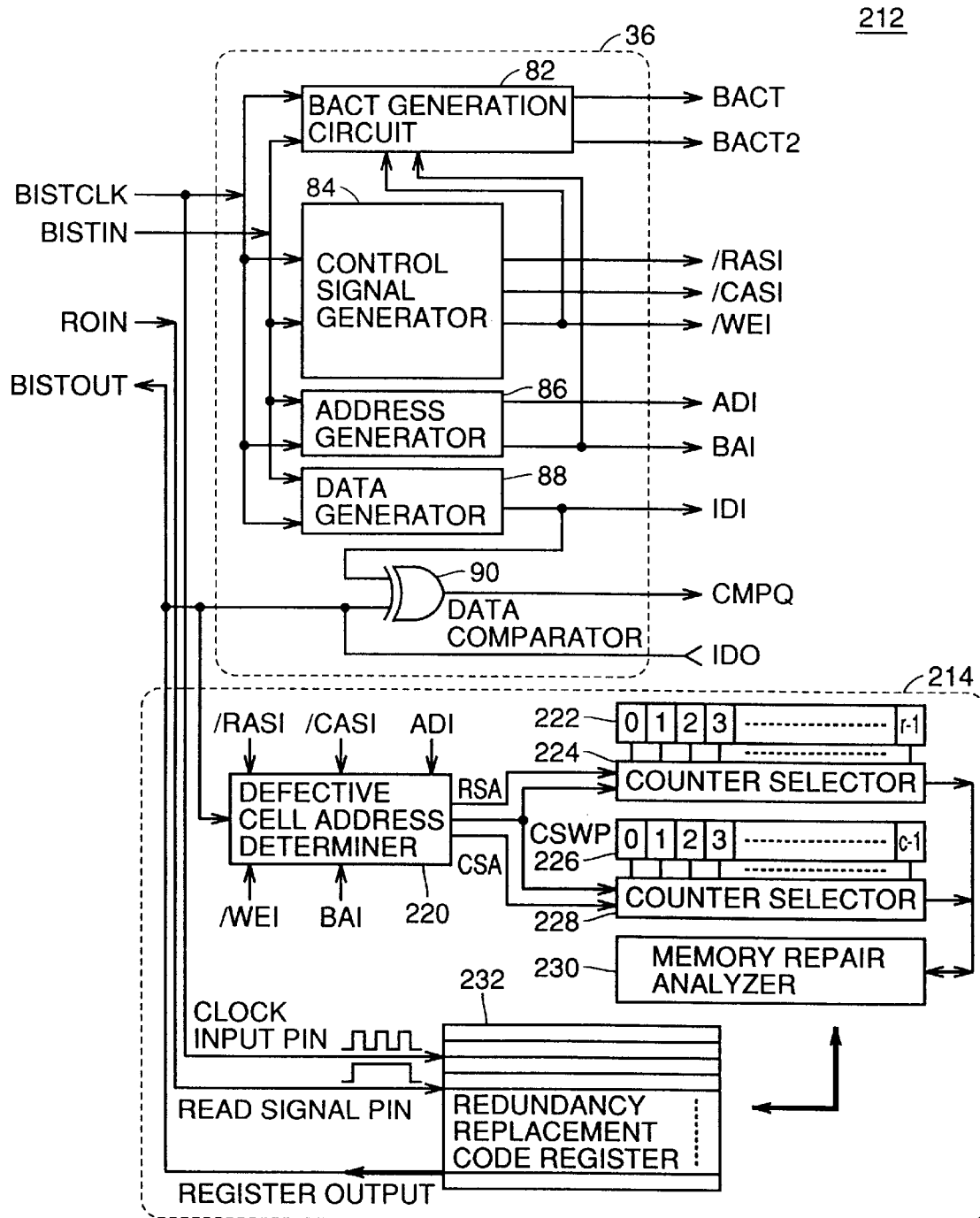
FIG. 14 is a block diagram showing a schematic configuration of test processing circuit 212 in FIG. 13.

FIG. 14 is a block diagram showing a schematic configuration of test processing circuit 212 in FIG. 13.

Referring to FIG. 14, test processing circuit 212 includes a BIST circuit 36 receiving self test control signal BISTIN and test clock signal BISTCLK and carrying out a self test, and a replacement information processing circuit 214 finding replacement address information for suitable replacement based on the defective cell address information of bank A tested in BIST circuit 36.

Since BIST circuit 36 has a similar configuration to the one shown in FIG. 5, description thereof will not be repeated.

Replacement information processing circuit 214 includes a defective cell address determiner 220 outputting information on a defective cell address only when a test result read from bank B indicates the defective cell, based on internal data output IDO read from bank B, address signal ADI, bank address signal BAI and control signals /WEI, /RASI, CASI, a counter selector 224 performing a control to increment a count value corresponding a designated column based on a defective column address signal RSA and a pulse signal for selection (hereinafter, referred to as selection pulse signal) CSWP output from defective cell address determiner 220, a count selector 228 performing a control to increment a count value corresponding to a designated column based on a defective column address signal CAS and a pulse signal CSWP output from defective cell address determiner 220, a row address defective bit counter 222 containing a plurality of counters counting the number of defective bits included in each normal row of bank A under the control of counter selector 224, and a column address defective bit counter 226 containing a plurality of counters counting the number of defective bits included in each normal column of bank A under the control of counter selector 228.

Banks A and B each include r normal rows in the row direction and c normal columns in the column direction. Therefore, a normal memory array has (r×c) bits. In addition to the normal rows and columns, bank A includes Sr spare rows concerning row addresses and Sc spare columns concerning column addresses. The defective bit information of bank A is stored in a corresponding address in the memory array of bank B.

Row address defective bit counter 222 has the 0th to (r−1)th counters corresponding to normal memory cell rows, and column address defective bits counter 226 has the 0th to (c−1)th counters corresponding to normal memory cell columns.

Replacement information processing circuit 214 further includes a memory repair analyzer 230 finding replacement address information by using information stored in row address defective bit counter 222 and column address defective bit counter 226, and a redundancy replacement code register 232 storing a repair code found by memory repair analyzer 230.

Figure 15:
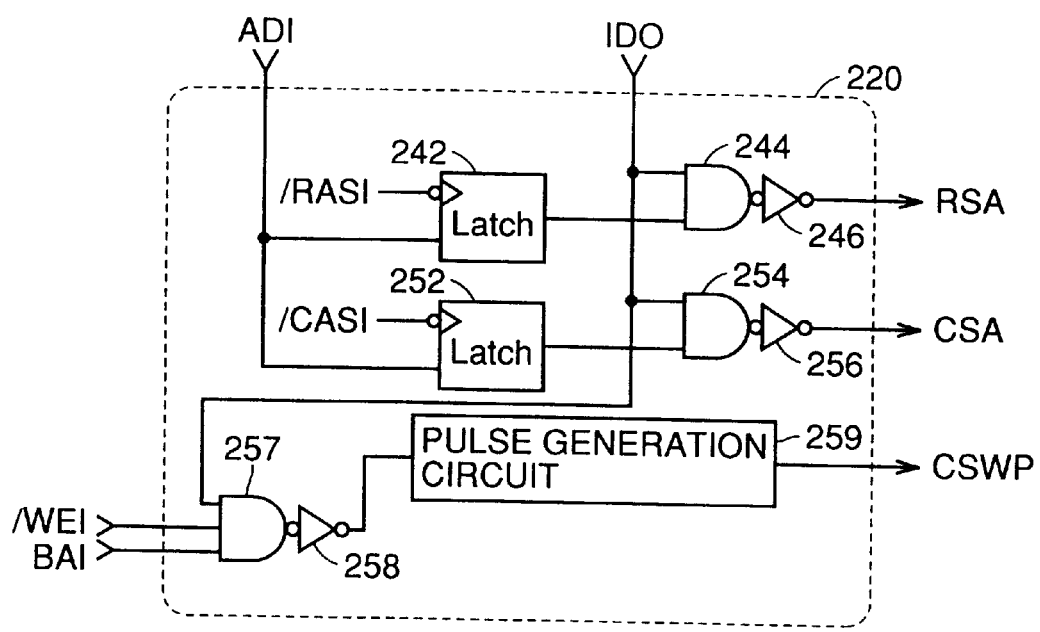
FIG. 15 is a circuit diagram showing a configuration of defective cell address determiner 220 in FIG. 14.

FIG. 15 is a circuit diagram showing a configuration of defective cell address determiner 220 in FIG. 14.

Referring to FIG. 15, defective cell address determiner 220 includes a latch 242 receiving internal address signal ADI according to control signal /RASI, a latch 252 receiving internal address signal ADI according to control signal /CASI, an NAND circuit 244 receiving internal data output signal IDO read from bank B and an output of latch 242, an inverter 246 receiving and inverting an output of NAND circuit 244 and outputting a defective row address signal RSA, an NAND circuit 254 receiving internal data output signal IDO and an output of latch 252, an inverter 256 receiving and inverting an output of NAND circuit 254 and outputting a defective column address signal CSA, and a 3-input NAND circuit 257 receiving internal data output signal IDO, control signal/WEI, and internal bank address signal BAI, an inverter 258 receiving and inverting an output of NAND circuit 257, and a pulse generation circuit 259 receiving an output of inverter 258 and generating a pulse signal CSVVP in response.

Figure 16:
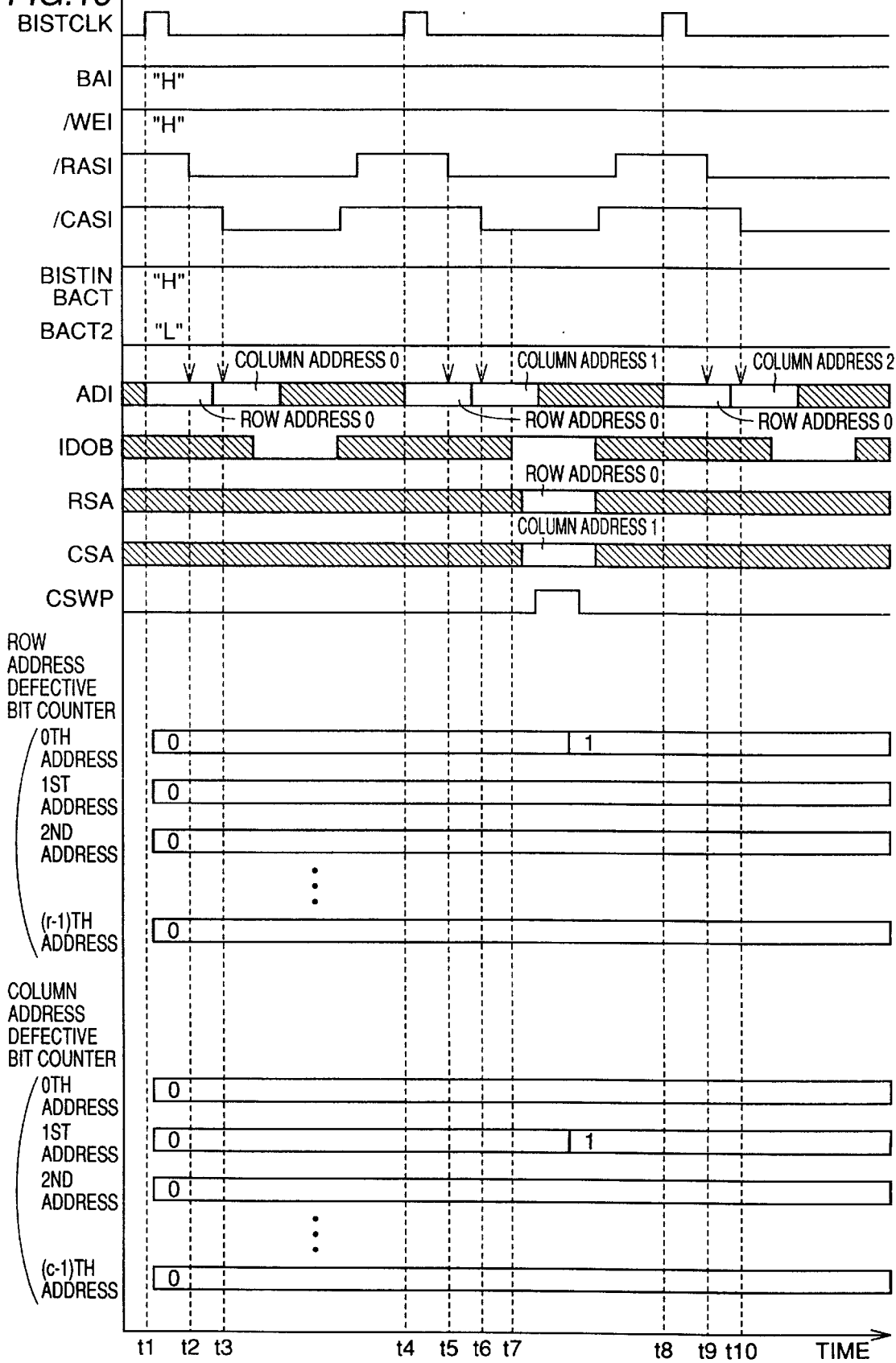
FIG. 16 is an operating waveform chart for describing a series of operations until row address defective bit counter 222 and column address defective bit counter 226 shown in FIG. 14 store the number of defective bits.

FIG. 16 is an operating waveform chart for describing a series of operations until row address defective bit counter 222 and column address defective bit counter 226 shown in FIG. 14 store the number of defective bits.

Assuming that the defective bit information of bank A has already been stored in bank B as an initial state.

It is also assumed that the counter values of the 0th to (r−1)th counters in row address defective bit counter 222 are called values at the 0th to (r−1)th addresses in row address defective bit counter 222, and the counter values of the 0th to (r−1)th counters in column address defective bit counter 226 are called values at the 0th to (c−1)th addresses in column address defective bit counter 226.

When reset cancellation is carried out and clock signal BISTCLK is input at time t1, BIST circuit 36 activates control signal /RASI at time t2 and control signal /CASI at time t3. Row address 0 is input to bank B at time t2, column address 0 is input to bank B at time t3, and a corresponding test result is output as internal data output signal IDOB. In this case, internal data output signal IDOB is at the L level, not indicating a defective bit.

When next clock signal BISTCLK is input at time t4, address generator 86 outputs row address 0 and column address 1. When control signals /RASI, /CASI are activated at time t5, t6, a corresponding memory cell of bank B outputs a test result as internal data output signal IDOB.

In this case, at time t7, internal data output signal IDOB is at the H level, indicating existence of a defective memory cell. Therefore, defective cell address determiner 220 outputs row address 0 and column address 1 at this time as a defective row address and a defective column address, and outputs pulse signal CSWP simultaneously. According to the timing of pulse signal CSWP, the value at the 0th address in the row address defective bit counter corresponding to row address 0 increases from 0 to 1. Similarly, the value at the first address in the column address defective bit counter increases from 0 to 1.

Thus, each time a signal indicating existence of a defective cell is output from bank B, a corresponding defective row address and defective column address are output from the defective cell address determiner, and the value at the corresponding addresses in the defective bit counters is incremented.

Count selectors 224, 228 are formed of a general purpose address decoder circuit, and row and column address defective bit counters 222, 226 are formed of a general purpose binary counter circuit. By thus reading the entire address space of bank B, the defective cell address count values for each row and column are stored in row address defective bit counter 222 and column address defective bit counter 226.

A process of finding replacement address information by utilizing row address defective bit counter 222 and column address defective bit counter 226 will be described in the following.

Figure 17:
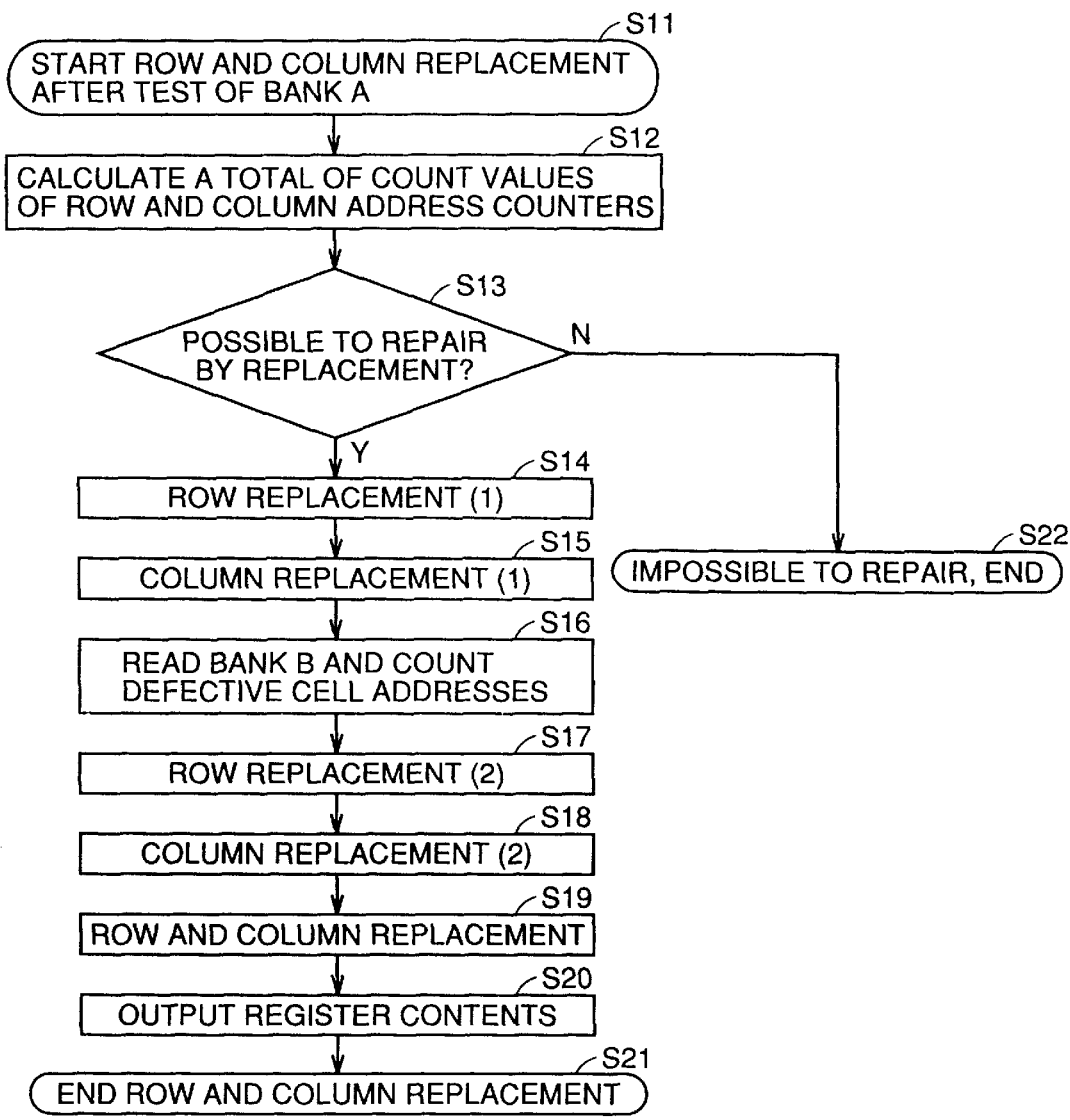
FIG. 17 is a flow chart for describing a process flow of finding address information for replacement.

FIG. 17 is a flow chart for describing a process flow of finding replacement address information.

Referring to FIG. 17, row and column replacement is started at step S11 after the end of testing bank A In step S12, a total of count values of the row and column address counters is calculated. In step S13, a determination is made as to whether repairing is possible by replacement. In other words, when the total of count values found in step S12 exceeds a prescribed value, repairing has become impossible. Thus, the process advances to step S22 where repairing is determined to be impossible and row and column replacement ends.

When there is a possibility of repairing, row replacement (1) described below is carried out in step S14. Then, column replacement (1) described below is carried out in step S15.

After replacement ends for some rows and columns, the defect information of bank B is read again to count defective cell addresses.

In step S17, row replacement (2) described below is carried out. In step S18, column replacement (2) described below is carried out. In step S19, row and column replacement described below is carried out. In step S20, the register contents corresponding to advances to be replaced which have been found so far are output. In step S21, row and column replacement ends.

Figure 18:
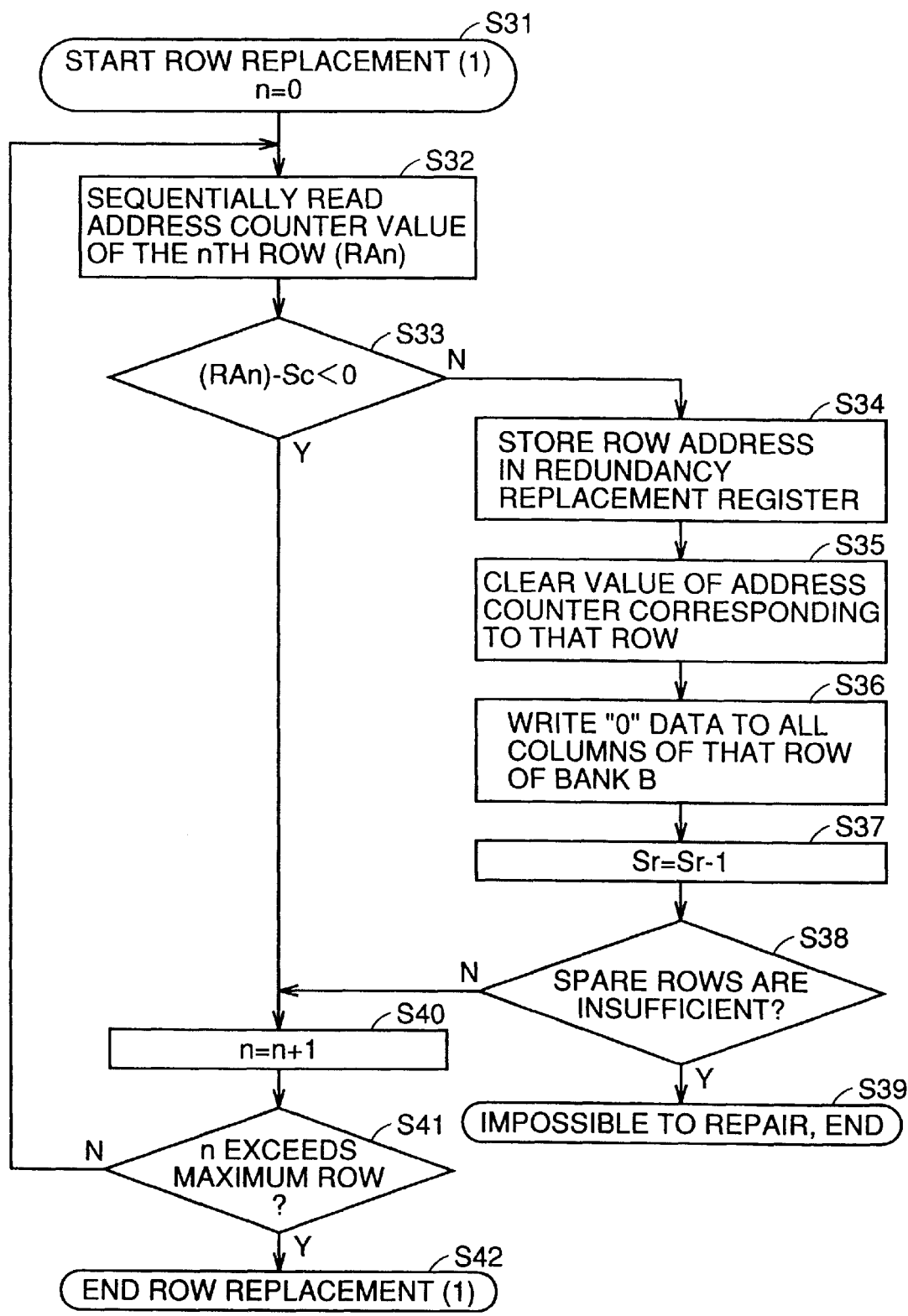
FIG. 18 is a flow chart showing a detailed process of row replacement (1) in step S14 shown in FIG. 17.

FIG. 18 is a flow chart showing a detailed process of row replacement (1) in step S14 shown in FIG. 17.

Referring to FIG. 18, row replacement (1) starts in step S31. The row address n of a row which is read at this time is such that n=0.

In step S32, the address counter value of the nth row (RAn) is read. In step S33, a determination is made as to whether the row cannot be replaced unless a spare row is used. If address counter value RAn is larger than the number Sc of spare columns, not all defective memory cells of row address n can be repaired unless a spare row is used. In other words, defective memory cells included in this row cannot be replaced even if all spare columns are used.

In this case, row address n is one of repair solutions. In this case, therefore, the process advances to step S34 where the row address is stored in redundancy replacement code register 232. Since defective bits of row address n are repaired, the value of the row address defective bit counter corresponding to row address n is cleared in step S35.

In step S36, data 0 not indicating a defective cell is written to all column addresses of the row, that is, row address n of bank B. Then, in step S37, the number of remaining spare rows is reduced by one since one spare row was used. If the number of spare rows is insufficient in step S38, repairing is determined to be impossible and the process ends in step S39. If the number of spare rows is sufficient, the process advances to step S40 where the address of the next row is found.

If the count value does not exceed the number of spare columns in step S33, the process advances directly to step S40 where the row address is incremented. If row address n does not exceed the maximum row of bank A in step S41, the process advances again to step S32 where the address counter value of the nth row (RAn) is read. If n exceeds the maximum row address of bank A, row replacement (1) ends in step S42.

Figure 19:
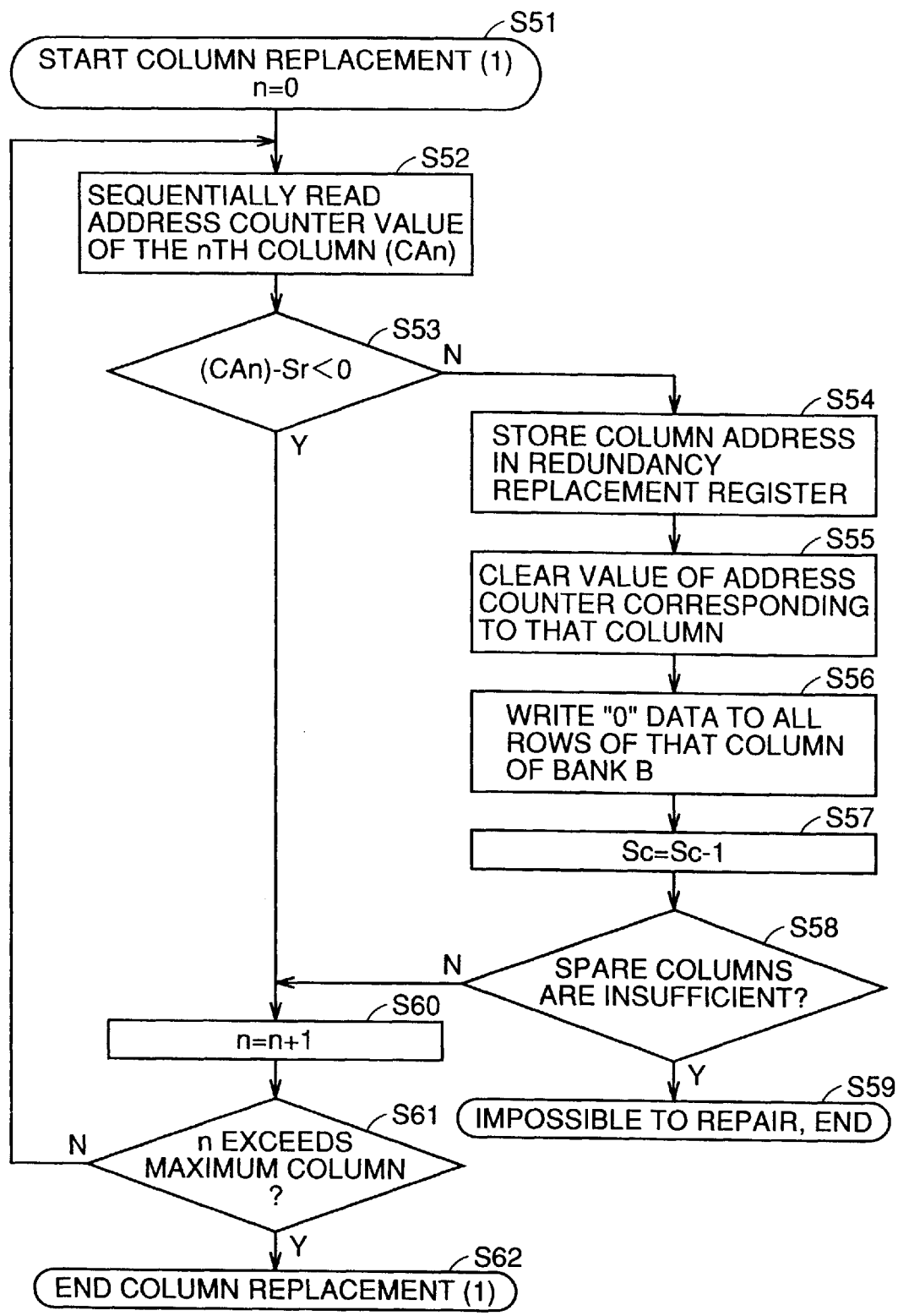
FIG. 19 is a flow chart showing a detailed process of column replacement (1) in step S15 shown in FIG. 17.

FIG. 19 is a flow chart showing a detailed process of column replacement (1) in step S15 shown in FIG. 17.

Referring to FIG. 19, column replacement (1) starts in step S51. The column address n of a column which is read at this time is such that n=0.

In step S52, the address counter value of the nth column (CAn) is read. In step S53, a determination is made as to whether the column cannot be replaced unless a spare column is used. If address counter value CAn is larger than the number Sr of spare rows, not all defective memory cells of column address n can be repaired unless a spare column is used. In other words, defective memory cells included in this column cannot be replaced even if all spare rows are used.

In this case, column address n is one of repair solutions. In this case, therefore, the process advances to step S54 where the column address is stored in redundancy replacement code register 232. Since the defective bits of column address n are repaired, the value of the column address defective bit counter corresponding to column address n is cleared in step S55.

In step S56, data 0 not indicating a defective cell is written to all rows of that column, that is, column address n of bank B. Then, in step S57, the number of remaining spare columns is reduced by one since one spare column was used. If the number of spare columns is insufficient in step S58, repairing is determined to be impossible and the process ends in step S59. If the number of spare columns is sufficient, the process advances to step S60 where the address of the next column is found.

If the count value does not exceed the number of spare rows in step S53, the process advances directly to step S60 where the column address is incremented. If column address n does not exceed the maximum column of bank A in step S61, the process advances again to step S52 where the address counter value of the nth column (CAn) is read. If n exceeds the maximum column address of bank A, column replacement (1) ends in step S62.

Figure 20:
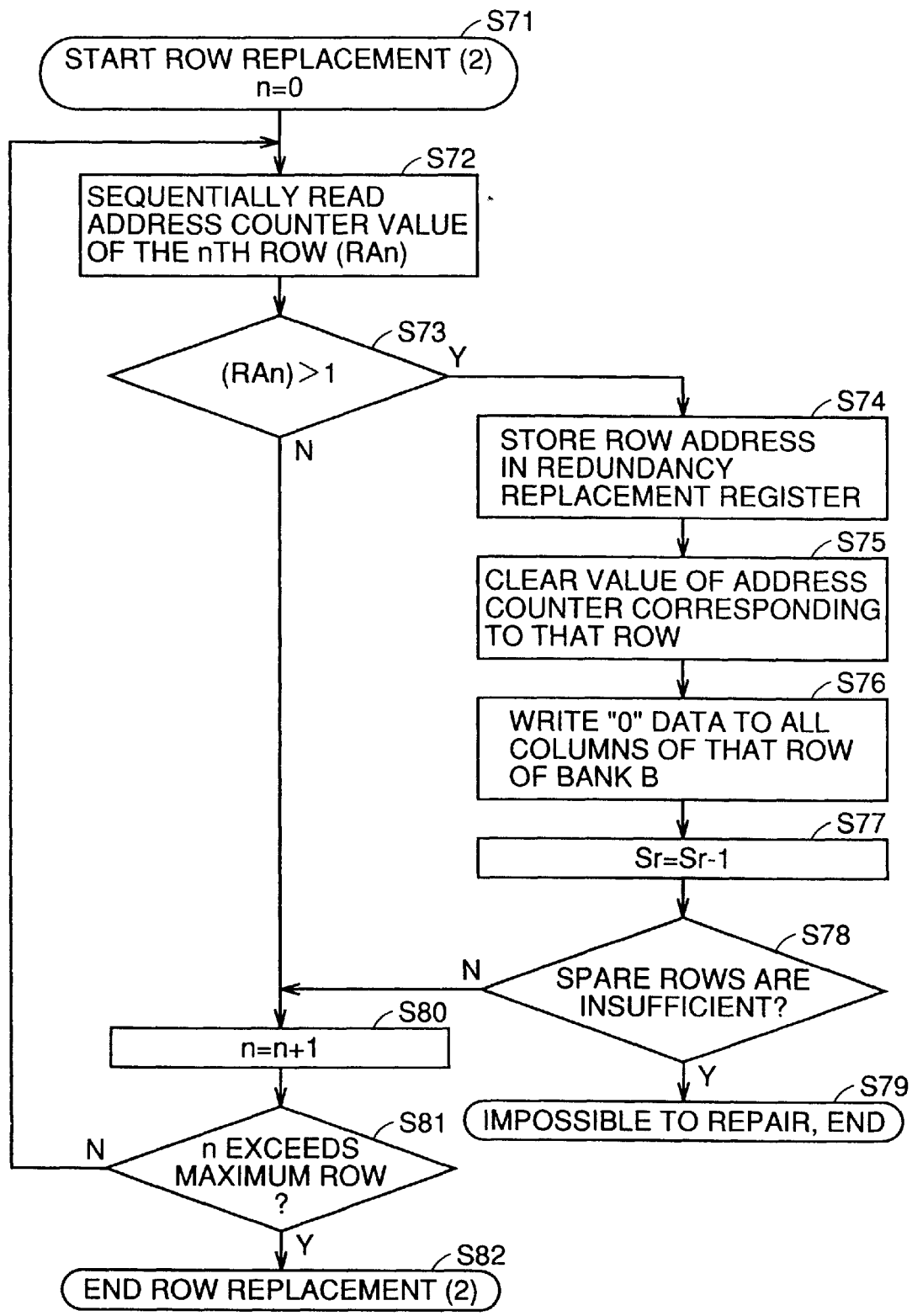
FIG. 20 is a flow chart showing a detailed process of row replacement (2) in step S17 shown in FIG. 17.

FIG. 20 is a flow chart showing a detailed process of row replacement (2) in step S17 shown in FIG. 17.

Referring to FIG. 20, row replacement (2) starts in step S71. The address n of a row which is read at this time is such that n=0.

In step S72, the address counter value of the nth row (RAn) is read. In step S73, a determination is made as to whether the row includes a plurality of defective memory cells. If address counter value RAn is larger than 1, defective memory cells can be repaired efficiently by using a spare row. In other words, a plurality of defective memory cells included in this row can be replaced by using one spare row.

In this case, row address n is one of repair solutions. In this case, therefore, the process advances to step S74 where row address n is stored in redundancy replacement code register 232. Since defective bits of row address n are repaired, the value of the row address defective bit counter corresponding to row address n is cleared in step S75.

In step S76, data 0 not indicating a defecting cell is written to all columns in that row, that is, row address n of bank B. Then, in step S77, the number of remaining spare rows is reduced by one since one spare row was used. If the number of spare rows is insufficient in step S78, repairing is determined to be impossible and the process ends in step S79. If the number of spare rows is sufficient, the process advances to step S80 where the address of the next row is found.

If the count value does not exceed 1 in step S73, repairing by a spare column may be more efficient, and thus the process advances directly to step S40 where the row address is incremented. If row address n does not exceed the maximum row of bank A in step S81, the process advances again to step S72 where the address counter value of the nth row (RAn) is read. If n exceeds the maximum row address of bank A, row replacement (2) ends in step S82.

Figure 21:
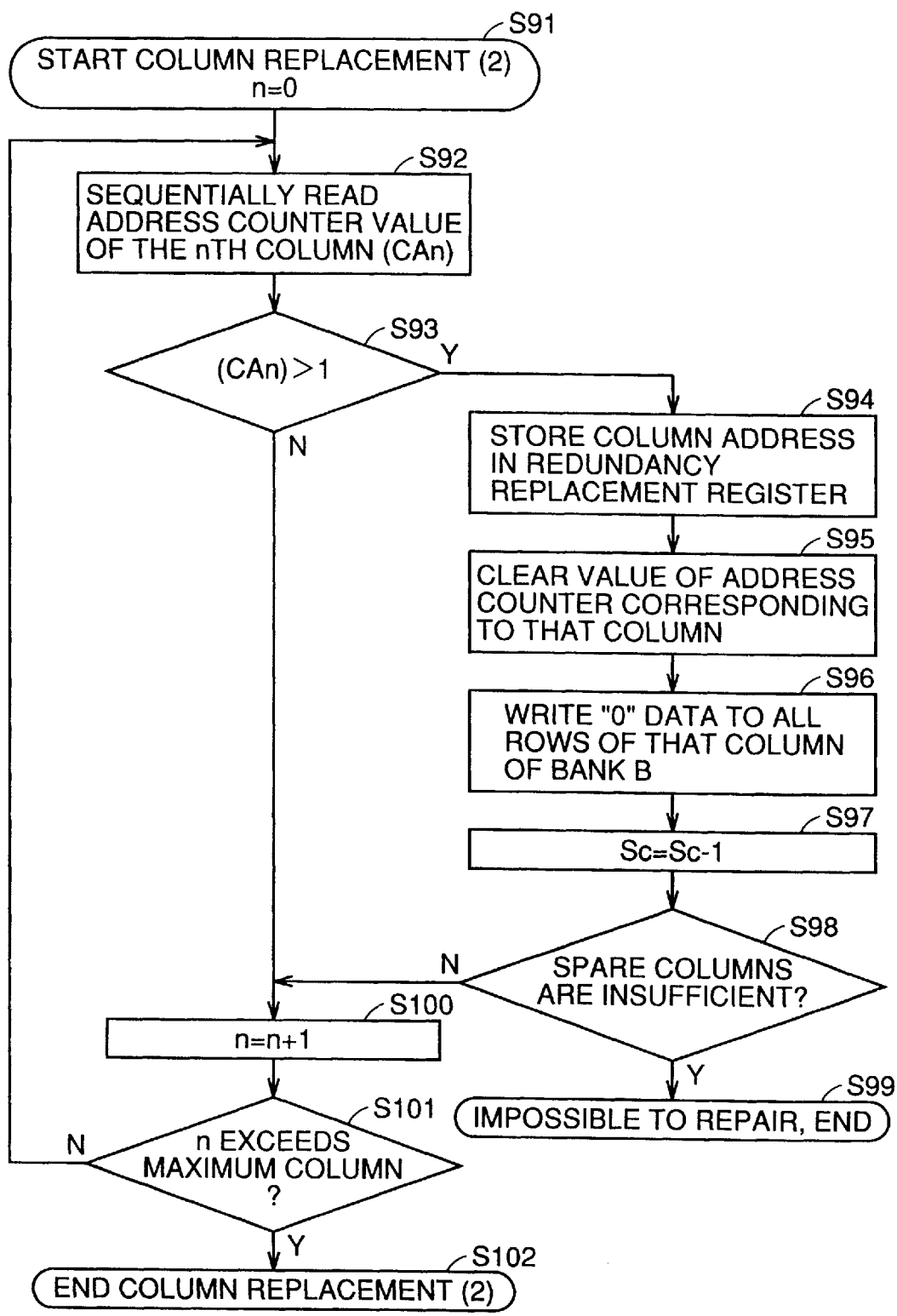
FIG. 21 is a flow chart showing a detailed process of column replacement (2) in step S18 shown in FIG. 17.

FIG. 21 is a flow chart showing a detailed process of column replacement (2) in step S18 shown in FIG. 17.

Referring to FIG. 21, column replacement (2) starts in step S91. The address n of a column which is read at this time is such that n=0.

In step S92, the address counter value of the nth column (CAn) is read. In step S93, a determination is made as to whether this column includes a plurality of defective memory cells. If address counter value CAn is larger than 1, defective memory cells can be repaired more efficiently by using a spare column. In other words, a plurality of defective memory cells included in this column can be replaced by using one spare column.

In this case, column address n is one of repair solutions. In this case, therefore, the process advances to step S94 where column address n is stored in redundancy replacement code register 232. Since defective bits of column address n are repaired, the value of the column address defective bit counter corresponding to column address n is cleared in step S95.

In step S96, data 0 not indicating a defective cell is written to all rows in that column, that is, column address n of bank B. Then, in step S97, the number of remaining spare columns is reduced by one since one spare column was used. If the number of spare columns is insufficient in step S98, repairing is determined to be impossible and the process ends in step S99. If the number of spare columns is sufficient, the process advances to step S100 where the address of the next column is found.

If the count value does not exceed the number of spare rows in step S93, the process advances directly to step S100 where the column address is incremented. If column address n does not exceed the maximum column of bank A in step S101, the process advances again to step S92 where the address count value of the nth column (RAn) is read. If n exceeds the maximum column address of bank A, column replacement (2) ends in step S102.

Figure 22:
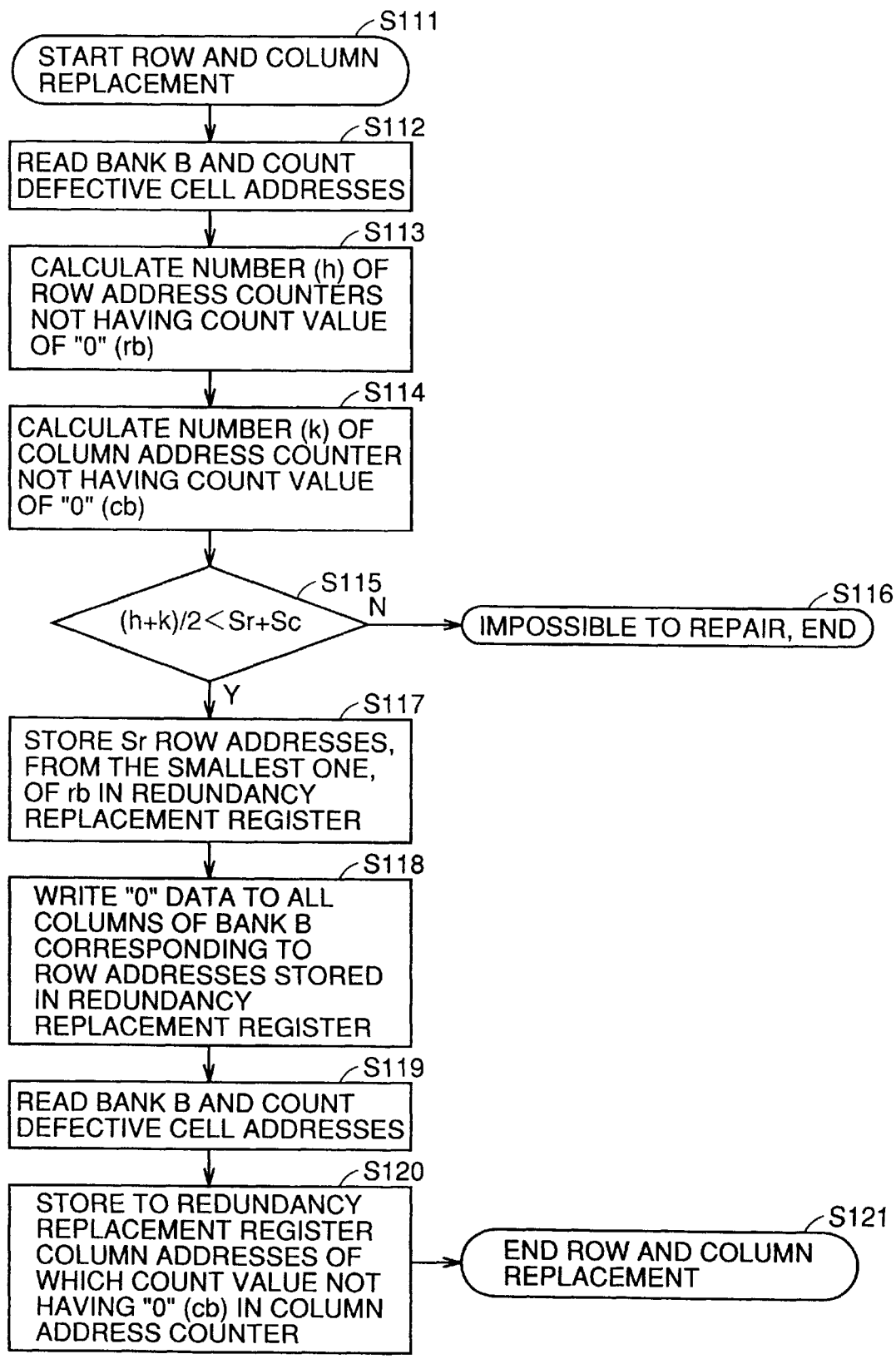
FIG. 22 is a flow chair showing a detailed process of row and column replacement in step S19 shown in FIG. 17.
Figure 23:
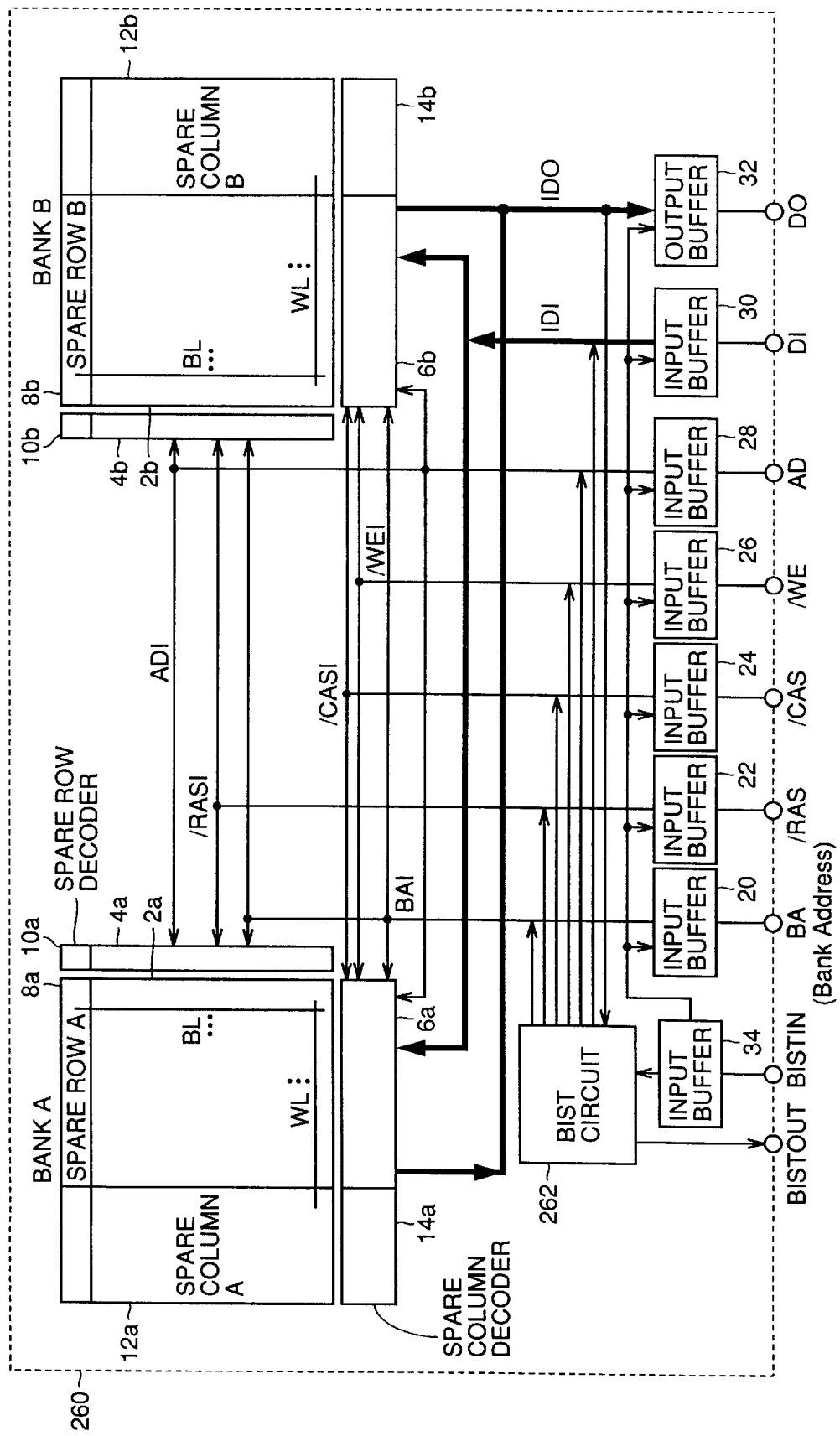
FIG. 23 is a block diagram showing a configuration sample of a conventional semiconductor device 260 containing a BIST function.
Figure 24:
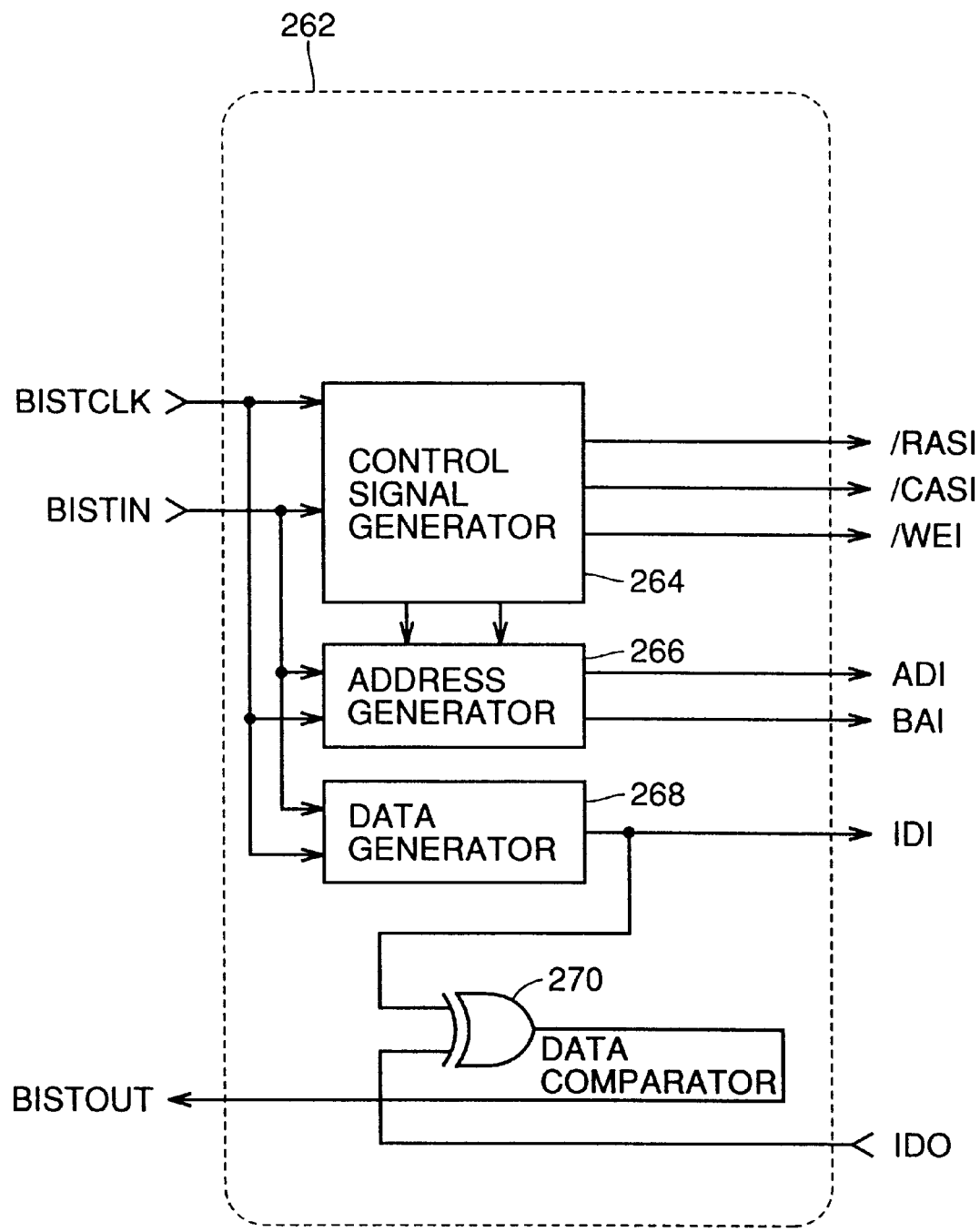
FIG. 24 is a block diagram showing a configuration of BIST circuit 262 shown in FIG. 23.
Figure 25:
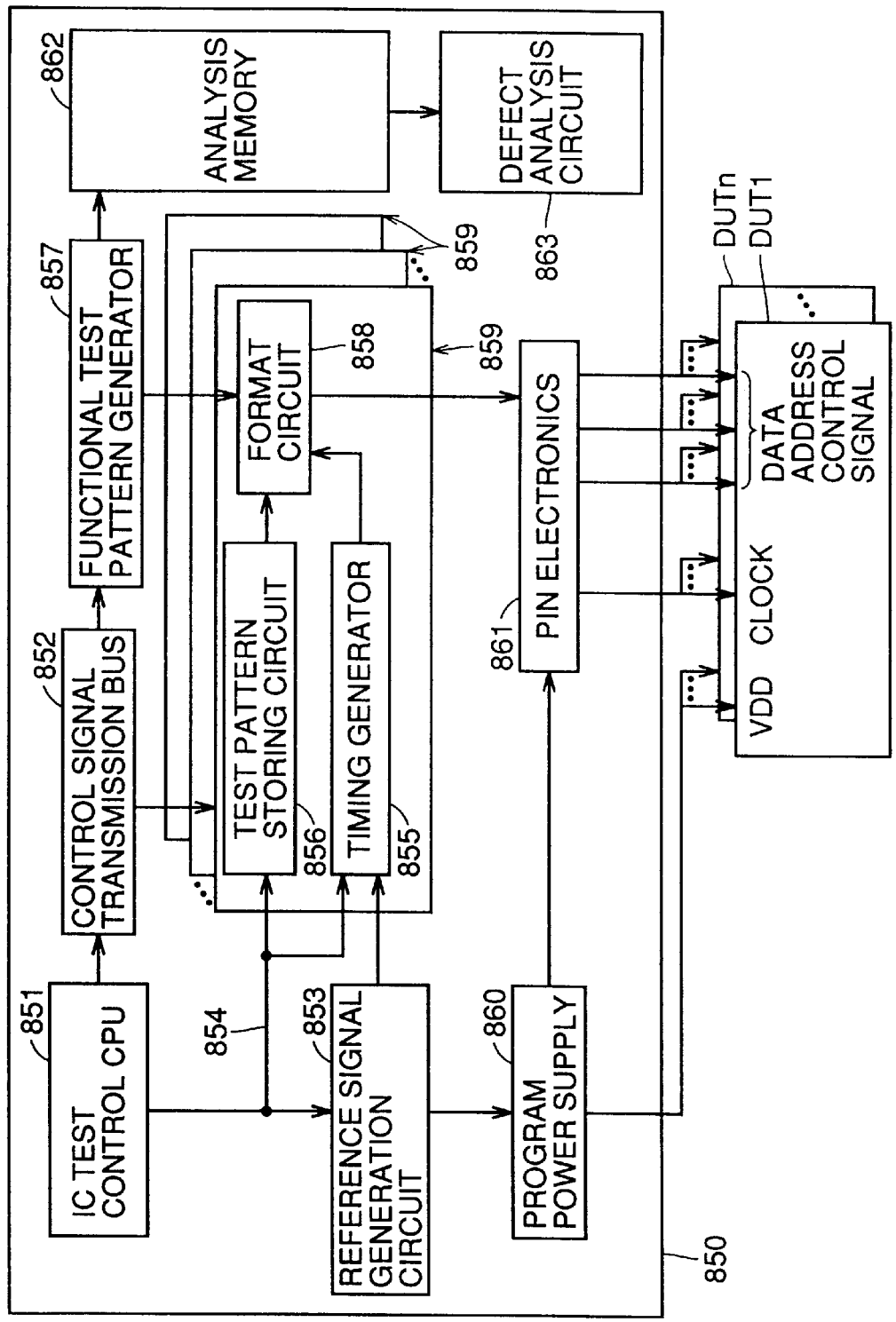
FIG. 25 is a diagram for describing a configuration of a conventional memory tester for finding an optimum solution to a bit defect.

FIG. 22 is a flow chart showing a detailed process of row and column replacement in step S19 shown in FIG. 17.

Referring to FIG. 22, row and column replacement in step S19 in FIG. 17 starts in step S111. In step S112, bank B is read to count defective cell addresses. Since rows having a plurality of defective bits in one row and columns having a plurality of defective bits in one column have already been repaired in steps S17, S18 in FIG. 17, all count values should be 1 or 0. In step S113, the number (h) of row address counters not having a count value of 0 (rb) is calculated.

Then, in step S114, the number (k) of column address counters not having a count value of 0 (cb) is calculated.

In step S115, a determination is made as to whether bit defects which have not been replaced can be repaired by using remaining all spare rows and columns. That is, it is determined as to whether the sum of remaining spare rows Sr and spare columns Sc is larger than (h+k)/2. If the sum of spare rows and spare columns is smaller, the process advances to step S116 where repairing is determined to be impossible and the process ends. If the sum of spare rows and spare columns is larger, the semiconductor device can be repaired and the process advances to step S117.

In step S117, the smallest to the (Sr)th addresses of rb are stored in redundancy replacement register 232. In other words, rows including defective bits are repaired, by using all spare rows, from the row with the smallest addresses.

In step S118, data 0 is written to all column addresses of rows corresponding to the row addresses of bank B stored in redundancy replacement code register 232.

In step S119, bank B is read again to count defective cell addresses.

In step S120, the column addresses of column address counters not having a count value of 0 (cb) are stored in redundancy replacement code register 232. In step S121, row and column replacement is ended.

A memory repair analyzer carrying out the operations shown in FIGS. 17 to 22 can be described such as by a general purpose hardware description language and its circuit diagram can be produced by automatic circuit production means such as a general purpose logic synthesizing tool. A repair solution found by this memory repair analyzer is transferred to redundancy replacement code register 232 shown in FIG. 14. The register may be formed of an SRAM, for example, and sequentially transmits its contents to the outside from register output pins if a read signal and a clock signal are externally applied. If it is read by an external reader, for example, replacement address information of bank A is obtained.

As described above, by providing a general purpose repair analyzer inside the device instead of finding replacement address information using an external device in the conventional manner, devices such as a redundancy analysis memory necessary for finding a redundancy repair code and a defective analysis memory do not have to be provided outside, and thus an inexpensive redundancy analysis system can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   (a) first and second memory regions carrying out a storing operation to hold applied data,
   said first and second memory regions each including
   (a-1) a plurality of normal memory cells arranged in rows and columns,
   (a-2) a spare row replacing a normal row including a defective memory cell in said plurality of normal memory cells, and
   (a-3) a spare column replacing a normal column including a defective memory cell in said plurality of normal memory cells; and
   (b) a memory control circuit controlling operation of said first and second memory regions according to a designated operation mode,
   said memory control circuit including
   (b-1) a self test circuit inactivated when said operation mode is a normal mode, and generating test data to be written to said first memory region, reading data held in said first memory region after said test data is written and determining whether or not a memory cell is good according to a comparison result of a read value and an expected value when said operation mode is a test mode, and
   (b-2) a data transfer circuit transmitting said test data to said first memory region and transferring said comparison result to said second memory region in said test mode.

2. The semiconductor device according to claim 1, wherein said data transfer circuit transmits applied write data to said first and second memory regions in said normal mode.

3. The semiconductor device according to claim 1, wherein
   said first memory region includes a first memory bank, and said second memory region includes a second memory bank carrying out said storing operation independently of said first memory bank in said normal mode.

4. The semiconductor device according to claim 3, wherein said data transfer circuit has an input switch circuit transmitting applied write data applied to an internal node to said second memory bank in said normal mode and transmitting said comparison result to said second memory bank in said test mode.

5. The semiconductor device according to claim 4, wherein said input switch circuit has a first switch circuit rendered conductive in said normal mode and transmitting said applied write data to said second memory bank to carry out said storing operation, and a second switch circuit rendered conductive in said test mode and transmitting said comparison result to said second memory bank.

6. The semiconductor device according to claim 3, wherein said memory control circuit further includes a bank selection circuit activating one of said first and second memory banks to carry out said storing operation in said normal mode and simultaneously activating said first and second memory banks in said test mode.

7. The semiconductor device according to claim 3, wherein said memory control circuit further includes a write control circuit setting said second memory bank to a writing mode when said first memory bank is set to a reading mode in said test mode.

8. The semiconductor device according to claim 3, wherein said memory control circuit transfers test results of a plurality of memory cells in said first memory bank to corresponding addressed memory cells in said second memory bank in said test mode.

9. The semiconductor device according to claim 8, wherein said memory control circuit further includes a processing circuit reading said test results stored in said second memory bank and finding addresses of a normal row and a normal column to be replaced, and said processing circuit has a row defective it counter counting the number of defective memory cells included in each normal row of said first memory bank, a column defective bit counter counting the number of defective memory cells included in each normal column of said first memory bank, and a memory repair analyzer finding a row address and a column address corresponding to said normal row to be replaced and normal column to be replaced, respectively, in response to the count values of said row defective bit counter and said column defective bit counter.

10. A method of testing a semiconductor device including first and second memory banks, a replacement circuit repairing a defective bit in said first and second memory banks, a self test circuit, and a data transfer circuit, comprising the steps of:

testing said second memory bank and repairing a defective memory cell included in said second memory bank by using said replacement circuit;

testing said first memory bank by using said self test circuit and writing a test result to said second memory bank through said data transfer circuit; and reading said test result written in said second memory bank and finding a row address and a column address corresponding to a normal row and a normal column to be replaced by a spare row and a spare column.

11. The method of testing a semiconductor device according to claim 10, wherein said step of writing the test result to said second memory bank includes the step of transferring test results of a plurality of memory cells included in said first memory bank to corresponding addressed memory cells in said second memory bank.

12. The method of testing a semiconductor device according to claim 10, wherein said step of finding said row address and column address includes a counting step of finding, as a row count value and a column count value corresponding to each normal row and each normal column, the number of defective memory cells included in each normal row and each normal column of said first memory bank in response to the test results stored in said second memory bank, a row-first replacement step of holding an address of a corresponding normal row as the address of the normal row to be replaced and dealing a corresponding test result in said second memory bank when said row count value exceeds a prescribed number, and a column-first replacement step of holding an address of a corresponding normal column as the address of the normal column to be replaced and clearing a corresponding test result in said second memory bank when said column count value exceeds a prescribed number.

13. The method of testing a semiconductor device according to claim 12, wherein said step of finding said row address and column address further includes a row and column replacement step of dividing defective memory cells into first and second groups according to the test results stored in said second memory bank after said row-first replacement step and said column-first replacement step, holding a row address of a defective memory cell in said first group as the row address of the normal row to be replaced and holding a column address of a defective memory cell in said second group as the column address of the normal column to be replaced.

* * * * *